(12) United States Patent
Tanaka et al.

(10) Patent No.: US 8,519,905 B2
(45) Date of Patent: Aug. 27, 2013

(54) ANTENNA SHEET, TRANSPONDER, AND BOOKLET

(75) Inventors: Junsuke Tanaka, Tokyo (JP); Akihisa Yamamoto, Tokyo (JP); Makoto Maehira, Kitakatsushika-gun (JP); Yoshiyuki Mizuguchi, Tokyo (JP)

(73) Assignee: Toppan Printing Co., Ltd., Tokyo (JP)

( * ) Notice: Subject to any disclaimer, the term of this patent is extended or adjusted under 35 U.S.C. 154(b) by 280 days.

(21) Appl. No.: 12/733,666

(22) PCT Filed: Sep. 12, 2008

(86) PCT No.: PCT/JP2008/066570
§ 371 (c)(1),
(2), (4) Date: Jul. 2, 2010

(87) PCT Pub. No.: WO2009/035094
PCT Pub. Date: Mar. 19, 2009

(65) Prior Publication Data
US 2010/0277382 A1    Nov. 4, 2010

(30) Foreign Application Priority Data

Sep. 14, 2007  (JP) ............................. P2007-239982
Jul. 18, 2008  (JP) ............................. P2008-187007

(51) Int. Cl.
*H01Q 7/00*    (2006.01)
(52) U.S. Cl.
USPC ........................... 343/866; 343/867; 343/868
(58) Field of Classification Search
USPC ................ 343/866, 867, 868, 872, 873, 741, 343/700 MS, 795; 340/572.7
See application file for complete search history.

(56) References Cited

U.S. PATENT DOCUMENTS

| | | | |
|---|---|---|---|
| 5,708,419 A | 1/1998 | Isaacson et al. | |
| 5,852,289 A | 12/1998 | Masahiko | |
| 6,233,818 B1 | 5/2001 | Finn et al. | |
| 6,249,254 B1* | 6/2001 | Bateman et al. | 343/700 MS |
| 6,353,420 B1* | 3/2002 | Chung | 343/895 |
| 6,786,419 B2 | 9/2004 | Kayanakis | |
| 2002/0190132 A1* | 12/2002 | Kayanakis | 235/492 |
| 2005/0007296 A1* | 1/2005 | Endo et al. | 343/895 |
| 2005/0046573 A1 | 3/2005 | Velasco et al. | |
| 2007/0063920 A1* | 3/2007 | Shionoiri et al. | 343/895 |
| 2008/0068272 A1* | 3/2008 | Matsushita et al. | 343/741 |
| 2008/0149731 A1* | 6/2008 | Arai et al. | 235/492 |
| 2008/0155822 A1 | 7/2008 | Finn | |

FOREIGN PATENT DOCUMENTS

| | | |
|---|---|---|
| JP | 9-109577 | 4/1997 |
| JP | 2002-042068 | 2/2002 |
| JP | 2002-109502 | 4/2002 |

(Continued)

OTHER PUBLICATIONS

European Search Report dated Sep. 29, 2010 and issued in corresponding European Patent Application 08830775.6.

(Continued)

*Primary Examiner* — Douglas W Owens
*Assistant Examiner* — Collin Dawkins

(57) ABSTRACT

An antenna sheet is provided with a flexible substrate, and an antenna coil, which is connected to a terminal section of an external IC module having an IC chip and is arranged on the substrate. On the substrate, a storing section that stores at least a part of the IC module is formed.

15 Claims, 15 Drawing Sheets

(56) References Cited

FOREIGN PATENT DOCUMENTS

| | | |
|---|---|---|
| JP | 2004-521429 | 7/2004 |
| JP | 2004-280503 | 10/2004 |
| JP | 2005-84757 | 3/2005 |
| JP | 3721520 | 9/2005 |
| JP | 2006-155224 | 6/2006 |
| JP | 2007-13131 | 1/2007 |
| RU | 2286600 | 10/2006 |
| TW | I256750 | 6/2006 |
| TW | 297501 | 9/2006 |
| TW | I274369 | 2/2007 |
| TW | M305942 | 2/2007 |
| TW | 200713074 | 4/2007 |
| WO | WO 02/103628 A1 | 12/2002 |
| WO | 2005/0104024 A1 | 11/2005 |
| WO | 2006/084984 | 8/2006 |

OTHER PUBLICATIONS

International Search Report, Form PCT/ISA/210, dated Dec. 9, 2008.
Russian Office Action issued Jun. 7, 2011 in corresponding Russian Patent Application 2010109058.
Taiwan Office Action mailed Mar. 28, 2012 issued in corresponding Taiwan Patent Application No. 097134957.
Russian Notice of Allowance issued Jun. 27, 2012 in corresponding Russian Patent Application No. 2010109058.
Japanese Office Action for application No. 2009-532247 issued Nov. 20, 2012.
Japanese Office Action mailed Mar. 12, 2013 for corresponding Japanese Application No. 2009-532247.

* cited by examiner

ANTENNA SHEET, TRANSPONDER, AND BOOKLET

The present invention relates to an antenna sheet, a transponder, and a booklet.

This application claims the benefit under 35 U.S.C. Section 371, of PCT International Application No. PCT/JP2008/066570, filed Sep. 12, 2008, witch claimed priority to Japanese Patent Application No. 2007-239982, filed Sep. 14, 2007, and Japanese Patent Application No. 2008-187007, filed Jul. 18, 2008, the contents of which are incorporated herein by reference.

BACKGROUND ART

There are conventionally known technologies for arranging a wire-wound antenna coil on a substrate and connecting it to an IC module to form a non-contact type communication unit which performs data communications with an external reading/writing device (e.g. see Patent Document 1).

In recent years, systems using non-contact IC card and non-contact IC tags are being used with the aim of enhancing security. To apply the excellent characteristics of such non-contact IC cards, IC tags, and the like in a booklet, such as a passport and a savings passbook, it is proposed to form a non-contact type information medium by pinching an IC inlet, with an antenna that is connected to a non-contact IC module, between outer-cover base materials, and mounting the medium on the booklet by bonding it to a front cover or the like thereof.

Since such a booklet enables electronic data to be entered to the IC inlet and printed, enhanced security characteristics and the like can be achieved.

Patent Document 2 describes one example of a booklet such as that described above. In this booklet, a non-contact type information medium is bonded to an inner face of a back cover of the booklet. The non-contact type information medium is configured such that, on a top-face side of a first base-material sheet, a second base-material sheet having an opening of a predetermined width is affixed to form a recess, an IC chip and an antenna coil attached thereto are provided in this recess, and an adhesive layer is provided on a bottom-face side of the first base-material sheet.

Patent Document 1: Japanese Patent No. 3721520
Patent Document 2: Japanese Patent Application, First Publication No. 2002-42068.

DISCLOSURE OF THE INVENTION

Problems to be Solved by the Invention

However, in the conventional technology described above, when the portion where the IC module and the wire-wound antenna coil are connected is subjected to repeated flexing, since the wire-wound antenna has an extremely narrow diameter of, for example, approximately 0.05 mm to 0.2 mm, there is a problem that the wire-wound antenna coil is liable to break after striking the edge of the terminal section of the IC module.

Furthermore, when using ultrasound welding and the like to connect the wire-wound antenna coil to the terminal section of the IC module, there is a problem of constriction in the connection sections of the wire-wound antenna coil, making it liable to break.

Furthermore, during a manufacturing process, it is necessary to wire each individual wire-wound antenna onto the substrate, making it difficult to increase productivity.

Furthermore, many booklets such as that described above are conventionally formed using paper and the like. Since chloride ions, water, and the like can easily permeate through paper, permeation of such substances sometimes leads to deterioration of the antenna and the like of the bonded non-contact type information medium. As a result, there is an adverse affect on the durability of the non-contact type information medium, leading to problems such as a possibility of a decline in the performance of the non-contact type information medium while the booklet is being used.

Furthermore, in conventional technology, since the IC module is fixed on the substrate, when a product in which the substrate and the IC module are covered with paper and the like is manufactured, there is a problem that the product becomes thicker. In this case, due to the flexibility of paper, there is a problem that the region where the IC module is installed expands and contacts other components, breaking the IC module and the like.

The present invention has been realized in view of these circumstances, and aims to provide an antenna sheet, a transponder, and a booklet that, when a product is manufactured by using a flexible base material such as paper to pinch an IC module, enables the product to be made thin.

Means for Solving the Problem

To solve the problems described above, an antenna sheet of the present invention includes a flexible substrate, and an antenna coil that is connected to a terminal section of an external IC module including an IC chip and is arranged on the substrate; a storing section that stores at least a part of the IC module being formed on the substrate.

When connecting the terminal section of the IC chip to a connection section of the antenna sheet, at least a part of the IC module can be stored in the storing section. Consequently, when securing the IC module to the substrate, the thickness of at least a part of the IC module is absorbed by the storing section, enabling the product (e.g. an inlet) to be made thin.

The antenna coil of the antenna sheet of the present invention is formed in a film shape, the width of the connection section of the antenna coil to be connected to the terminal section is larger than the width of the antenna coil, and a pair of the connection sections are arranged opposing each other at portions pinching the storing section in the substrate.

With this configuration, when the IC module terminal section and the antenna coil connection section is subjected to repeated flexing, and a stress acts on the antenna coil, since the antenna coil is formed in a film shape, in comparison with a conventional wire-wound antenna coil, flexibility is enhanced, and concentration of stress can be prevented. Moreover, since the width of the connection section to be connected to the terminal section of the IC module is increased, stress can be dispersed in the width direction and prevented from concentrating. In addition, since the antenna coil is formed on the substrate, the substrate functions as a reinforcing member for the antenna coil. This can prevent the antenna coil from striking the edge of the terminal section of the IC module. Therefore, breakage of the antenna coil can be prevented.

When connecting the connection sections to the terminal section, since the connection section of the antenna coil, which is film-shaped and has an increased width, is connected to the terminal section of the IC module, constriction is unlikely to occur during connecting as it does when using a conventional wire-wound antenna coil. Therefore, breakage of the connection sections can be prevented.

Furthermore, when the substrate is plasticized and flows due to heat, since the antenna coil is formed in a film shape, in comparison with a conventional wire-wound antenna, the contact area of the antenna coil with the substrate increases, and the flow resistance of the antenna coil can be increased. Therefore, it is possible to prevent the antenna coil from moving according to the flow of the substrate, and to improve the reliability of data communication.

Furthermore, since the film-shaped antenna coil can be manufactured collectively by, for example, etching and the like, in comparison with a manufacturing process in which wire-wound antenna coils are individually wired, productivity can be noticeably increased.

The antenna sheet of the present invention includes a chloride ion-resistant layer formed such as to cover the antenna coil.

With this configuration, since the chloride ion-resistant layer is formed such as to cover the antenna coil, even if incorporated in a booklet made of paper and such like, the antenna coil is not damaged by chloride ions that permeate the paper.

The antenna sheet of the present invention includes a water-resistant layer formed such as to cover the antenna coil.

With this configuration, since the water-resistant layer is formed such as to cover the antenna coil, even if incorporated in a booklet made from paper and such like, the antenna coil is not damaged by chloride ions that permeate the paper.

Furthermore, in the antenna sheet of the present invention, the widths of the connection sections are smaller or similar to the width of the terminal section.

With this configuration, the connection sections can be connected to the terminal section along the entire width in the width direction. This enables the connection sections to be more reliably connected to the terminal section, and increases the reliability of the antenna coil.

Furthermore, in the antenna sheet of the present invention, the terminal section and the connection sections are connected such as to overlap in a direction linking the opposing connection sections, and the length of the connection sections is larger than the. length of a region where they overlap with the terminal section.

With this configuration, in connecting the connection sections and the terminal section, when they are connected such as to overlap in the direction linking the opposing connection sections, the edge of the terminal section is further to the inside than the edge sides of the length direction of the connection sections. Consequently, the edge of the terminal section contacts the connection sections, whose width is larger than the antenna coil. Therefore, when the portion where the terminal section of the IC module connects to the connection sections of the antenna coil is subjected to repeated flexing, the edge of the terminal section can be received by the connection sections with increased widths. This can prevent concentration of stress, and can prevent breakage of the antenna coil.

Furthermore, in the antenna sheet of the present invention, slit holes are provided in the substrate and in the connection sections.

With this configuration, if flexing and the like is applied and cracks occur in the width direction of the connection sections, when the cracks reach the slit holes, there is communication between the cracks traveling in the width direction and the slit holes extending in the length direction, stopping the progression of the cracks in the width direction. Therefore, the cracks can be prevented from crossing the slit holes and progressing in the width direction, and breakage of the antenna coil can be prevented.

Furthermore, in the antenna sheet of the present invention, a through hole that penetrates the substrate is formed in a region of the substrate where the antenna coil is not formed.

With this configuration, when bonding base materials to both sides of the antenna sheet, the base materials can be joined together via the through hole. The through hole can also increase the flexibility of the antenna sheet, make the antenna sheet lighter, and reduce the quantity of base material used.

Furthermore, in the antenna sheet of the present invention, the connection sections of the antenna sheet are welded to the terminal section of the IC module at a plurality of points.

With this configuration, when connecting the terminal section of the IC module to the connection section of the antenna sheet, a plurality of points can be alloyed or thermally fused, and thereby fixed. In comparison with when they are fixed at only one point, the connection strength of the terminal section of the IC module and the connection section of the antenna sheet with respect to flexing can be increased.

A transponder of the present invention includes an antenna sheet including a flexible substrate and an antenna coil that is connected to a terminal section of an external IC module including an IC chip and is arranged on the substrate, a storing section that stores at least a part of the IC module being formed on the substrate, and an IC module including an IC chip and a terminal section; the IC module is fixed to the antenna sheet, and the antenna sheet is connected to the terminal section of the IC module.

With this configuration, the antenna sheet including the transponder can prevent breakage of the antenna coil, increasing the reliability of data communication, and further increasing productivity.

Therefore, according to the transponder of the present invention, it is possible to provide an inlet that enables breakage of the antenna coil to be prevented, has high data communications reliability, and high productivity.

Furthermore, the transponder of the present invention includes a pair of base materials that pinch the antenna sheet and the IC module.

With this configuration, the antenna sheet including the transponder can prevent breakage of the antenna coil, increase the reliability of data communication, and further increase productivity. The base materials can also reinforce the connection points between the connection sections of the antenna sheet and the terminal section of the IC module.

Therefore, according to the present invention, it is possible to provide a transponder that can prevent breakage of the antenna coil, and that has high reliability of data communication and high productivity.

Furthermore, in the transponder of the present invention, a base material opening for storing at least a part of the IC module is provided in at least one of the pair of base materials.

With this configuration, the thickness of the section of the IC module that is stored in the base material opening is absorbed by the base material, enabling the transponder to be made thin.

Furthermore, in the transponder of the present invention, a through hole is formed in the antenna sheet, and the pair of base materials are joined via the through hole.

With this configuration, the base materials can be joined together via the through hole of the antenna sheet. This increases the strength of the joint between the transponder and the base materials, and can prevent peeling of the base materials from the antenna sheet.

Furthermore, in the transponder of the present invention, a cover material is joined to a face of at least one of the pair of base materials.

With this configuration, the external appearance and texture of the transponder can be altered to suit its purpose, enabling it to be applied in various fields. Also, since the transponder includes the antenna sheet, it becomes possible to provide a transponder which can prevent breakage of the antenna coil, and which achieves highly reliable data communication and high productivity.

Furthermore, in the transponder of the present invention, the pair of base materials are porous or have a fibrous structure.

With this configuration, since the thickness of the antenna sheet can be absorbed by the base materials which are porous or have a fibrous structure, a flatter transponder can be manufactured.

When the transponder of the present invention is applied in a data carrier with non-contact type IC such as, for example, a card-shaped commuter pass with IC or an electronic money card, the antenna sheet including the inlet can prevent breakage of the antenna coil of the data carrier with non-contact type IC, thereby increasing the reliability of data communication and increasing productivity.

When the transponder of the present invention is applied in an inlay for a booklet or a book cover, such as, for example, a booklet-shaped identification certificate such as a passport or a pass book, the antenna sheet including the inlay can prevent breakage of the antenna coil of the data carrier with non-contact type IC, thereby increasing the reliability of data communication and increasing productivity.

A problem of using a conventional substrate made from a thermoplastic material with a low softening point such as PET-G is that, when manufacturing a product by thermal lamination of the substrate, the wire-wound antenna fixed on the substrate moves in accordance with softening and flow of the substrate due to heat, affecting the data communication characteristics and reducing the reliability.

In contrast, since the substrate of the antenna sheet described above is formed from polyethylene naphthalate or polyethylene terephthalate, whereby the heat-resistance temperature of the substrate can be increased in comparison with that of conventionally used thermoplastic materials with a low softening point such as PET-G. Consequently, when, for example, manufacturing a product by thermal lamination of a substrate, even if the substrate is subjected to heat, it can be prevented from plasticizing and flowing. Therefore, the antenna coil can be prevented from moving in accordance with the flow of the substrate, and reliability of data communication can be increased.

A booklet of the present invention includes an antenna sheet including a flexible substrate, and an antenna coil that is connected to a terminal section of an external IC module including an IC chip and is arranged on the substrate, a storing section that stores at least a part of the IC module being formed on the substrate, an IC module including an IC chip and a terminal section, and a pair of base materials that pinch the antenna sheet and the IC module; the IC module being fixed to the antenna sheet, and the antenna sheet being connected to the terminal section of the IC module.

Effect of the Invention

According to the present invention, when using a flexible base material such as paper to pinch an IC module and manufacture a product, it is possible to provide an antenna sheet, a transponder, and a booklet that can make the product thin.

BRIEF DESCRIPTION OF THE DRAWINGS

FIG. 13 is a view showing a booklet which a non-contact type information medium according to a fourth embodiment of the present invention is attached to.

REFERENCE SYMBOLS

| | |
|---|---|
| 1, 1A, 1B, 1C, 1D | Antenna sheet 1 |
| 2 | Substrate |
| 4 | Antenna coil |
| 7 | Opening |
| 8, 9 | Antenna connecting lands (Connection sections) |
| 12, 13, | Reinforcing patterns (reinforcing sections) |
| 18 | Slit holes |
| 19B, 19C, 19D | Through holes |
| 20 | IC module |
| 22 | IC chip |
| 25 | Antenna land (terminal section) |
| 30 | Inlet |
| 40 | Inlay |
| 41, 42 | Base materials |
| 100 | Electronic passport (inlay with cover, data carrier with non-contact type IC) |
| 101, 101A | Booklet 101 |
| 110, 110A | Non-contact type information medium |
| 112 | Sheet |
| 112A | Through hole |
| 113 | Antenna coil |
| 114 | IC chip |
| 115 | Porous base materials |
| 116 | Adhesive (chloride ion-resistant layer) |
| W1, W2, W3, W4 | Width |
| L, L3, L4 | Length |

BEST MODE FOR CARRYING OUT THE INVENTION

<First Embodiment>

Subsequently, a first embodiment of the invention will be explained based on the drawings.

(Antenna Sheet)

Figure 1A:
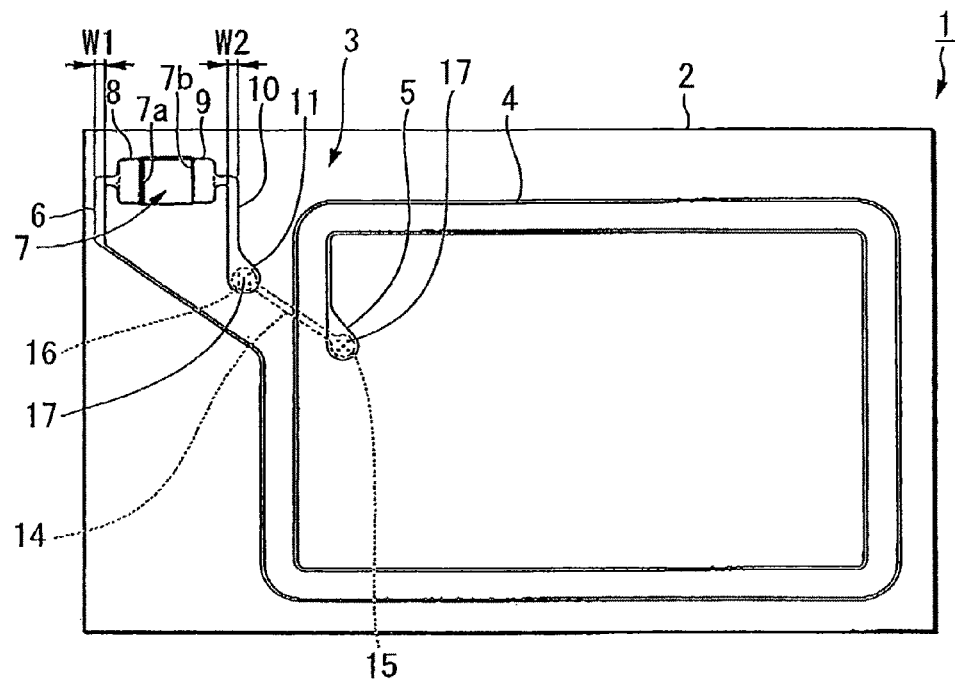
FIG. 1A is a plan view of an antenna sheet according to a first embodiment of the present invention.
Figure 1B:
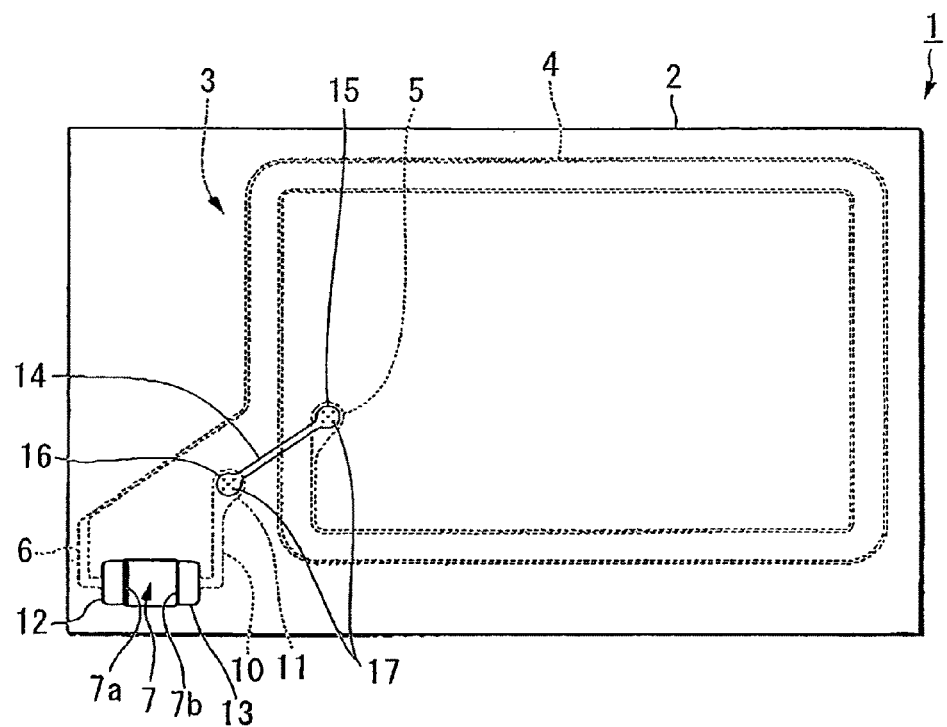
FIG. 1B is a bottom view of an antenna sheet according to a first embodiment of the present invention.

FIG. 1A is a plan view of an antenna sheet 1 according to this embodiment, and FIG. 1B is a bottom view. As shown in FIG. 1A, the antenna sheet 1 includes a flexible substrate 2 formed from, for example, polyethylene naphthalate (PEN) or polyethylene terephthalate (PET). The thickness of the substrate 2 is selected as appropriate within a range of, for example, approximately 0.02 mm to approximately 0.10 mm. An antenna circuit 3 is formed on a surface of the substrate 2.

The antenna circuit 3 is made by performing etching and the like to pattern an aluminum thin film formed on the surface of the substrate 2, and is formed in a thin-film shape having a thickness of approximately 0.02 mm to 0.05 mm.

The antenna circuit 3 includes an antenna coil 4 formed in a roughly rectangular spiral shape that corresponds to the shape of the substrate 2. An inside end of the antenna coil 4 expands in volume in a roughly circular shape, forming a terminal section 5. Bent portions (rectangle corners) of the antenna coil 4 are formed in roughly circular arc shapes.

An outside end 6 of the antenna coil 4 is led toward one corner of the substrate 2. A roughly rectangular opening 7 is formed slightly to the antenna coil 4 side of one corner of the substrate 2. The opening 7 can store a part of an IC module explained later. While a storing section that can store a part of the IC module is here described as being the opening 7, this is not limitative of the invention. For example, instead of providing an opening in the substrate 2, a recess can be provided as a storing section, with part of the IC module being accommodated in this recess. In comparison to using a recess, an opening obtains a deeper storing section with more space for storing the IC module, and can therefore increase the planarity of the antenna sheet 1.

The outside end 6 of the antenna coil 4 that is led toward one corner of the substrate 2 is led toward one side 7a of the opening 7, and is connected to an antenna connecting land 8 (connecting section) which is formed along the side 7a. The antenna connecting land 8 is a roughly rectangular terminal section formed by increasing the width W1 of the antenna coil 4.

An antenna connecting land 9 (connecting section) is formed on one side 7b opposing the side 7a of the opening 7 where the antenna connecting land 8 is formed. A wire 10 is one part of the antenna coil 4, and is connected to the antenna connecting land 9 formed opposing the antenna connecting land 8. In a manner similar to the opposing antenna connecting land 8, the antenna connecting land 9 is formed in a roughly rectangular shape along the side 7b of the opening 7 by increasing the width W2 of the wire 10. One end of the wire 10 connects to the antenna connecting land 9, and another end side increases in volume in a roughly circular shape to form a terminal section 11.

As shown in FIG. 1B, reinforcing patterns 12 and 13 (reinforcing sections) that reinforce the antenna connecting lands 8 and 9 are formed on a face on an opposite side to the face where the antenna circuit 3 is formed, in correspondence with the formation regions of the antenna connecting lands 8 and 9. The reinforcing patterns 12 and 13 are formed in rectangular shapes corresponding to the shapes of the antenna connecting lands 8 and 9 along the outlines of the antenna connecting lands 8 and 9 when viewed from above by, for example, etching and the like of a metal thin film as used for the antenna circuit 3, or by a similar method.

By thus forming the reinforcing patterns 12 and 13 in correspondence with the formation regions of the connection section 8 on the face of an opposite side to the face where the antenna circuit 3 including the antenna connecting land 8 of the substrate 2 is formed, the connection section 8 can be supported by both the substrate 2 and the reinforcing patterns 12 and 13 formed on the rear side thereof, whereby the connection section 8 can be reinforced. This increases the flexural strength of the connection section 8, and can prevent breakage of the antenna coil 4 even when the section where a terminal section 25 of an IC module 20 and the connection section 8 of the antenna coil 4 are connected is subjected to repeated flexing.

A jumper wire 14 is formed on a face on the opposite side to the face where the antenna circuit 3 of the substrate 2 is formed, and connects the terminal section 5 of the antenna coil 4 to the terminal section 11. The jumper wire 14 is formed using, for example, a similar method to that used for the antenna circuit 3. Both ends of the jumper wire 14 are increased in volume in a roughly circular shape to form terminal sections 15 and 16. The terminal sections 15 and 16 of the jumper wire 14 are provided in correspondence with the formation regions of the terminal section 5 and the terminal section 11 of the antenna coil 4 respectively. The terminal sections 15 and 16 of the jumper wire 14 and the terminal sections 5 and 11 of the antenna coil 4 are electrically connected together in conductive sections 17, which are formed in a plurality of point-like shapes in the formation regions of the terminal sections 15 and 16.

Figure 2A:
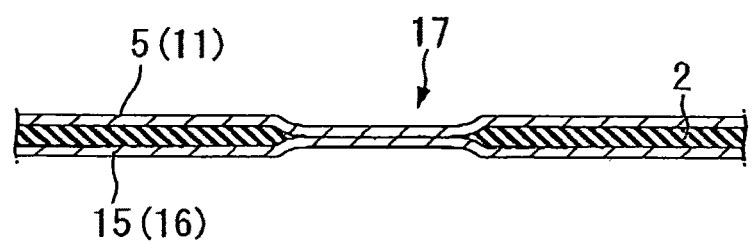
FIG. 2A is a cross-sectional view of a connection section of a jumper wire and an antenna circuit of the antenna sheet according to the first embodiment of the present invention.

As shown in FIG. 2A, the conduction section 17 is for example formed by a crimping process of applying pressure to the terminal section 15 (terminal section 16) of the jumper wire 14 and the terminal section 5 (terminal section 11) of the antenna coil 4 such as to pinch them from both sides, thereby breaking the substrate 2 and achieving physical contact between the terminal sections 5 and 15 (11 and 16).

Figure 2B:
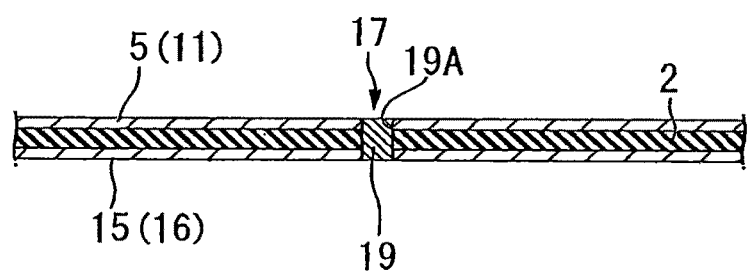
FIG. 2B is a cross-sectional view of a connection section of a jumper wire and an antenna circuit of the antenna sheet according to the first embodiment of the present invention.

The conduction section 17 can be formed using a method other than the connection by the crimping process described above; as shown in FIG. 2B, for example, it is acceptable to form a through hole 19A that penetrates the formation regions of the terminal sections 5 and 15 (11 and 16), fill the through hole 19A with a conductive paste 19 such as silver paste, and electrically connect the terminal section 15 (terminal section 16) of the jumper wire 14 to the terminal section 5 (terminal section 11) of the antenna coil 4.

(IC Module)

Subsequently, an IC module 20 connected to the antenna circuit 3 of the antenna sheet 1 will be explained.

Figure 3A:
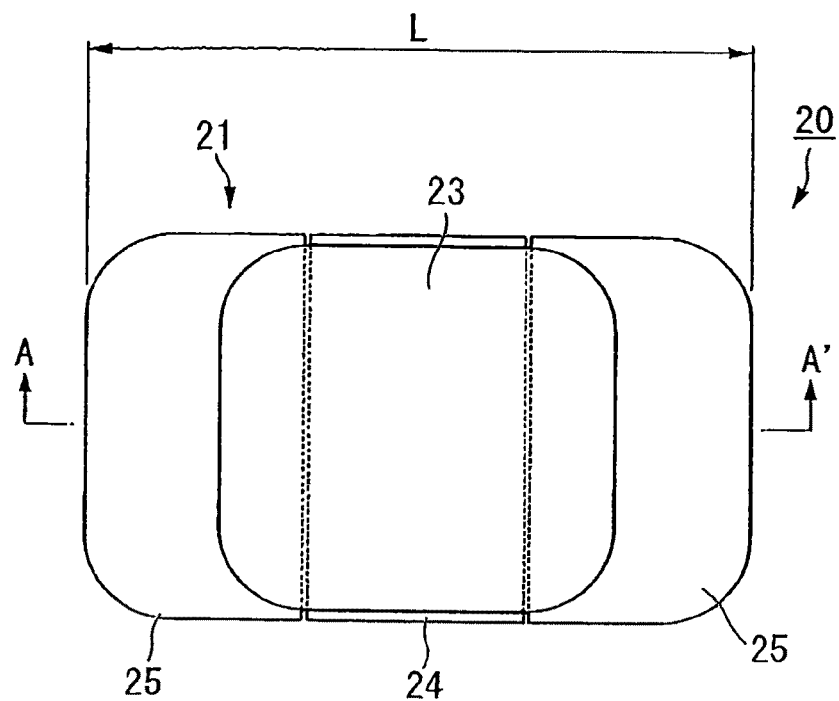
FIG. 3A is a plan view of an IC module according to the first embodiment of the present invention.
Figure 3B:
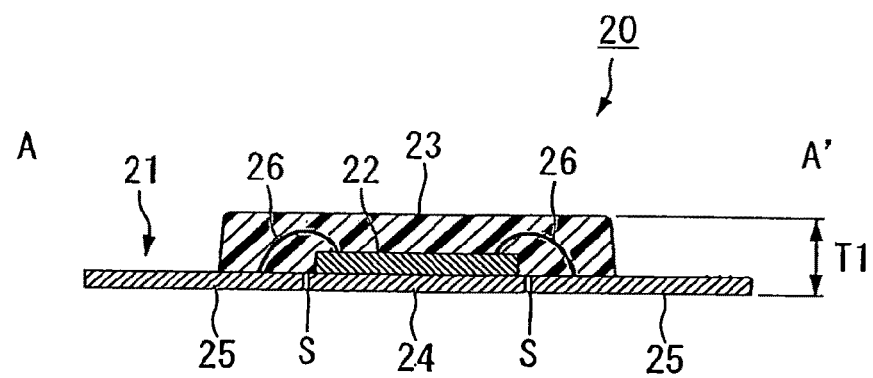
FIG. 3B is a cross-sectional view taken along the line A-A' in a plan view of an IC module according to the first embodiment of the present invention.

FIG. 3A is a plan view of an IC module 20 according to this embodiment, and FIG. 3B is a cross-sectional view taken along the line A-A' of FIG. 3A.

As shown in FIGS. 3A and 3B, the IC module 20 is formed from a lead frame 21, an IC chip 22 mounted on the lead frame 21, and a sealing resin section 23 that seals the IC chip 22.

The lead frame 21 is formed roughly in the shape of a rectangle with its corners rounded to circular arc shapes when viewed from above. The lead frame 21 is formed from, for example, a copper-thread metal film and the like made by weaving copper thread into a film and silver plating this film.

The lead frame 21 includes a die pad 24 that securely supports the IC chip 22, and an antenna land 25 (terminal section) that is connected to an input/output pad of the IC chip 22.

The die pad 24 is slightly larger than the outer shape of the IC chip 22, and is fixed to the bottom of the IC chip 22. A gap S is provided between the die pad 24 and the antenna land 25, electrically insulating them from each other.

The antenna land 25 is connected to the input/output pad of the IC chip 22 by bonding wires 26 of, for example, gold (Au). Since the antenna land 25 is used as a terminal section of the IC module 20 that is connected to an external circuit, it is formed extending along the long direction (length L direction) of the IC module 20.

The sealing resin section 23 is formed roughly in the shape of a square with its corners rounded to circular arc shapes when viewed from above. The sealing resin section 23 is formed from, for example, a resin material such as epoxy resin, and covers the IC chip 22, the input/output pad of the IC chip 22, the bonding wires 26, the connection section between the antenna land 25 and the bonding wires 26, etc. The sealing resin section 23 is filled into the gap S between the die pad 24 and the antenna land 25, and extends across both of them. Here, the thickness T1 of the IC module 20 is, for example, approximately 0.3 mm.

(Inlet (also Termed Transponder))

Figure 4A:
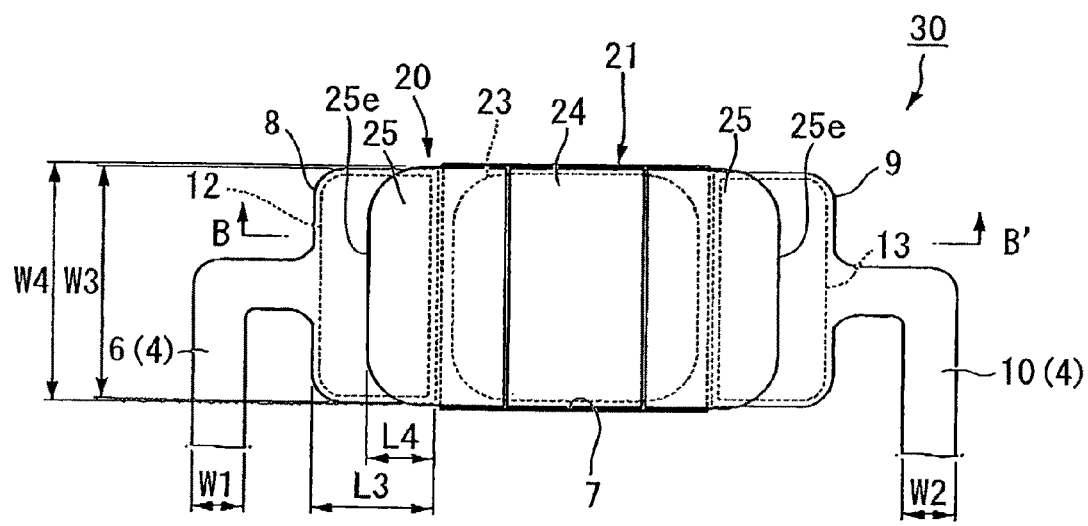
FIG. 4A is an enlarged plan view of an inlet according to the first embodiment of the present invention.
Figure 4B:
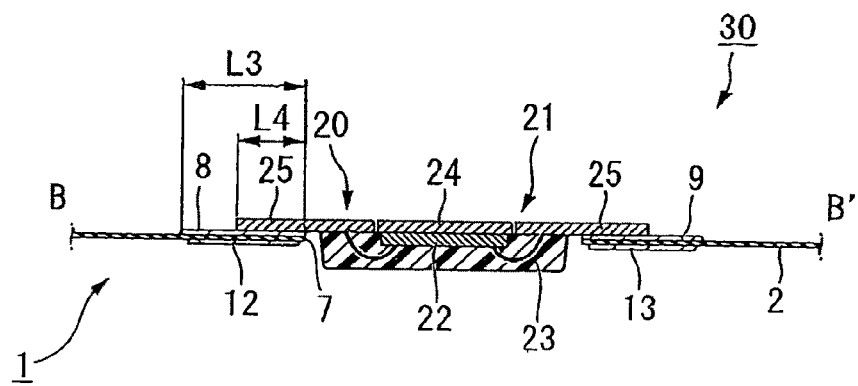
FIG. 4B is a cross-sectional view taken along the line B-B' in an enlarged plan view of an inlet according to the first embodiment of the present invention.

As shown in FIGS. 4A and 4B, by electrically connecting the antenna land 25 of the IC module 20 to the antenna connecting lands 8 and 9 of the antenna sheet 1, and thereby securing the IC module 20 to the antenna sheet 1, there is formed an inlet 30 that includes the antenna sheet 1 and the IC module 20.

Here, the opening 7 of the antenna sheet 1 is opened in a roughly square shape corresponding to the sealing resin section 23, and slightly larger than the outer shape of the sealing resin section 23, enabling the opening 7 to store the roughly square-shaped sealing resin section 23 of the IC module 20.

The width W3 of the pair of antenna connecting lands 8 and 9 provided opposing each other on both sides of the opening 7 of the antenna sheet 1 is roughly the same as, or slightly smaller than, the width W4 of the antenna land 25 of the IC module 20.

The length L3 of the antenna connecting lands 8 and 9 of the antenna sheet 1 is larger than the length L4 of overlapping sections of the antenna land 25 of the IC module 20 and the antenna connecting lands 8 and 9. In this embodiment, the length L3 of the antenna connecting lands 8 and 9 is roughly twice the length L4 of the overlapping sections of the antenna land 25 and the antenna connecting lands 8 and 9.

Subsequently, an operation of this embodiment will be explained.

When the inlet 30 shown in FIGS. 4A and 4B is subjected to repeated flexing, this applies a stress to the section where the antenna land 25 of the IC module 20 is connected to the antenna connecting lands 8 and 9 of the antenna sheet 1. At this time, since the antenna coil 4 is formed by patterning of an aluminum thin film on the substrate 2, its flexibility is superior to that of a conventional antenna coil formed by winding a wire, and stress is prevented from concentrating in specific points.

Forming the antenna coil 4 from aluminum in this manner can achieve a lower cost than when using another metal, such as copper, to form the antenna coil 4. Furthermore, when joining the antenna connecting land 8 of the antenna coil 4 and the antenna land 25 of the IC module 20, optimizing the joining conditions enables them to be alloyed or thermally fused, and firmly joined together.

The width W3 of the antenna connecting lands 8 and 9 of the antenna coil 4 connected to the antenna land 25 of the IC module 20 is made larger than the widths W1 and W2 of the antenna coil 4, so that it is roughly the same as, or slightly smaller than, the width W4 of the antenna land 25. This can disperse the stress in the width W3 direction, and prevent it from concentrating. Furthermore, the antenna connecting lands 8 and 9 can be connected along the entire width of the antenna land 25 in the width W4 direction, and the antenna connecting lands 8 and 9 can be reliably connected to the antenna land 25, enhancing the reliability of the antenna coil 4 and the inlet 30.

The length L3 of the antenna connecting lands 8 and 9 of the antenna sheet 1 is made larger than the length L4 of the overlapping sections between the antenna land 25 of the IC module 20 and the antenna connecting lands 8 and 9. Furthermore, in this embodiment, the length L3 of the antenna connecting lands 8 and 9 is roughly twice as long as the length L4 of the overlapping sections between the antenna land 25 and the antenna connecting lands 8 and 9. As a result, edges 25e of the antenna land 25 are connected such as to be positioned roughly at the center of the insides of the ends of the antenna connecting lands 8 and 9 on the antenna coil 4 side. The edges 25e of the antenna land 25 consequently contact roughly with the centers of the antenna connecting lands 8 and 9 whose width W3 is made larger than the widths W1 and W2 of the antenna coil 4.

Therefore, when the sections where the antenna land 25 of the IC module 20 is connected to the antenna connecting lands 8 and 9 of the antenna coil 4 are subjected to repeated flexing, the edges 25e of the antenna land 25 can be received roughly in the centers of the antenna connecting lands 8 and 9 whose width W3 is made larger. This can prevent concentration of stress in the antenna coil 4, and can thereby prevent breakage of the antenna coil 4.

In addition, since the antenna coil 4 and the antenna connecting lands 8 and 9 are formed on the substrate 2, the substrate 2 functions as a reinforcing material for them. This prevents the antenna coil 4 with small widths W1 and W2 from making contact with the edges 25e of the antenna land 25, and can prevent breakage of the antenna coil 4.

Reinforcing patterns 12 and 13 that reinforce the antenna connecting lands 8 and 9 are formed on a face of the substrate 2 that is on the opposite side to the face where the antenna circuit 3, in correspondence with the formation regions of the antenna connecting lands 8 and 9. The antenna connecting lands 8 and 9 are thus supported by both the substrate 2 and the reinforcing patterns 12 and 13 on its rear face, whereby the antenna connecting lands 8 and 9 can be reinforced.

Therefore, the flexural strength of the antenna connecting lands 8 and 9 is increased, and, when the sections where the antenna land 25 of the IC module 20 is connected to the antenna connecting lands 8 and 9 of the antenna coil 4 are subjected to repeated flexing, breakage of the antenna connecting lands 8 and 9, and breakage of the antenna coil 4, can be prevented.

Even if the substrate 2 breaks due to stress, for example, the reinforcing patterns 12 and 13 can be made to contact the antenna connecting lands 8 and 9, whereby they can assist the antenna connecting lands 8 and 9, and prevent the antenna coil 4 from breaking.

Furthermore, since the thin-film antenna coil 4 of this embodiment can be manufactured collectively by, for example, etching and the like, in comparison with a manufacturing process in which wire-wound antenna coils are individually wired, productivity of the antenna sheet 1 can be noticeably increased.

(Inlet Manufacturing Method)

Subsequently, a method of manufacturing the inlet 30 by connecting the antenna connecting lands 8 and 9 of the antenna sheet 1 to the antenna land 25 of the IC module 20 will be explained.

When connecting the antenna connecting lands 8 and 9 of the antenna sheet 1 to the antenna land 25 of the IC module 20, as shown in FIGS. 4A and 4B, the sealing resin section 23 of the IC module 20 is stored in the opening 7 of the antenna sheet 1, and the antenna land 25 is connected to the antenna connecting lands 8 and 9 in such a manner that they face each other.

Figure 5A:
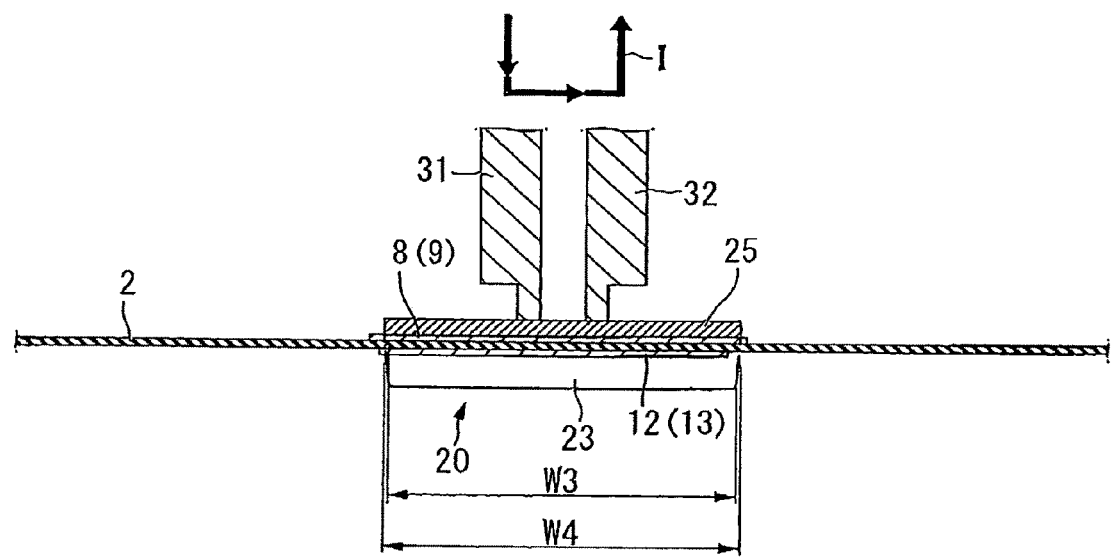
FIG. 5A is an explanatory cross-sectional view of a manufacturing method of an inlet according to the first embodiment of the present invention.

The connection between the antenna land 25 and the antenna connecting lands 8 and 9 is accomplished by, for example, resistance welding or laser welding. As shown in FIG. 5A, in resistance welding, a pair of welding electrodes 31 and 32 are separated and made to contact in the width W4 direction of the antenna land 25 of the IC module 20. A pressure of approximately $5N/mm^2$ to $70N/mm^2$, and preferably approximately $40N/mm^2$, is then applied from welding electrodes 31 and 32 between the antenna land 25 and the antenna connecting land 8. That is, a pressure of approximately $2.5N/mm^2$ to $35N/mm^2$, and preferably approximately $20N/mm^2$, is applied from each of the welding electrodes 31 and 32. The coupling can be made more reliable by welding at multiple spots.

While the above pressure is being applied, a welding current I is fed from one welding electrode 31 to the other welding electrode 32. A voltage is applied between the welding electrodes 31 and 32 for a time of approximately 0.5 ms to 10.0 ms, such that the welding current I becomes, for example, approximately 300A to 600A. Consequently, current I supplied from the welding electrode 31 enters the antenna connecting land 8 from the antenna land 25, and enters the antenna land 25 from the antenna connecting land 8 at the point where the other welding electrode 32 makes contact. At this time, heat is generated at the interface between the antenna land 25 and the antenna connecting land 8 in the section where the welding electrodes 31 and 32 make contact.

Due to the heat generated at this interface, the antenna land 25 and the antenna connecting land 8 are welded and alloyed or thermally fused, thereby joining them together. Moreover, by reversing the direction of the welding current I, it is possible to achieve a well-balanced joint between the antenna land 25 and the antenna connecting land 8 at the sections where the welding electrodes 31 and 32 made contact.

If the voltage, pressing force, and voltage application time are adjusted in the manner described above, the joining conditions can be optimized, enabling the antenna land 25 and the antenna connecting land 8 to be alloyed or thermally fused, and firmly joined together.

When pressure is applied between the antenna land 25 and the antenna connecting land 8 in the manner described above, the contact resistance of the antenna land 25 and the antenna connecting land 8 decreases. This weakens the resistant heating, and reduces in the welding energy of the antenna connecting land 8, which is made from aluminum having lower welding temperature than the antenna land 25. Scattering of the antenna connecting land 8 during welding can thereby be prevented, and a stable joint can be obtained.

Subsequently, the antenna connecting land 9 and the antenna land 25 are joined by welding, according to the same procedure as that of joining the antenna connecting land 8 and the antenna land 25.

Thus, it is possible to manufacture an inlet 30 wherein the antenna land 25 of the IC module 20 and the antenna connecting lands 8 and 9 of the antenna sheet 1 are welded at two points in the width W4 direction.

Figure 5B:
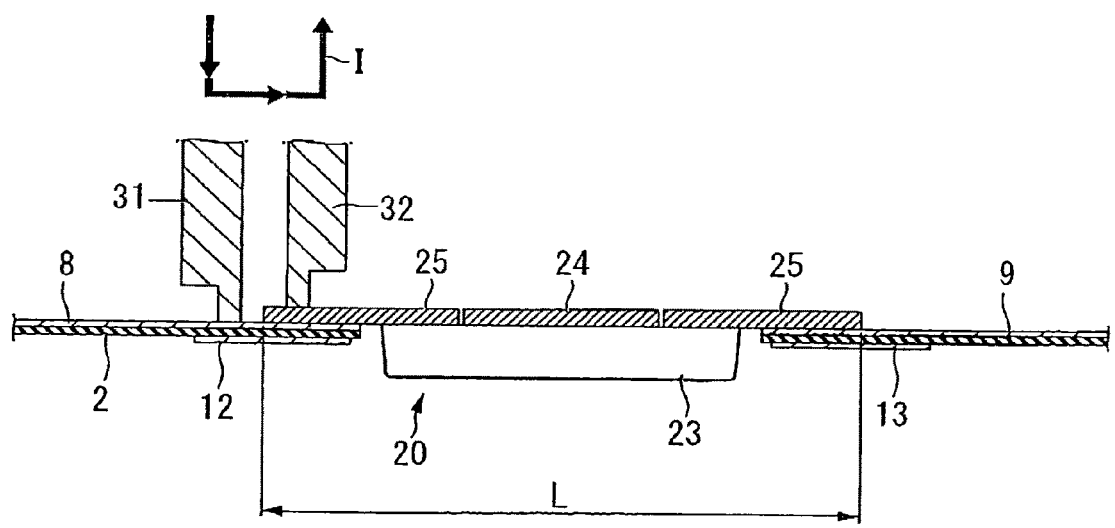
FIG. 5B is an explanatory cross-sectional view of a manufacturing method of an inlet according to the first embodiment of the present invention.

As shown in FIG. 5B, in resistance welding, it is possible to arrange the pair of welding electrodes 31 and 32 in a separated manner in the length L direction of the IC module 20, make one of the welding electrodes 31 contact the antenna connecting land 8, and make the other welding electrode 32 contact on a point on the antenna land 25 where the antenna land 25 and the antenna connecting land 8 are joined. In this case, the antenna land 25 and the antenna connecting land 8 are pressured by applying a pressure of approximately $5N/mm^2$ to $70N/mm^2$, preferably approximately $40N/mm^2$, to the welding electrode 32 provided on the antenna land 25.

Subsequently, while the above pressure is being applied, a welding current I is fed from one welding electrode 31 to the other welding electrode 32. The current, voltage, and application time of the welding current I are the same as in the resistance welding described in FIG. 5A. At this time, the current I supplied from the welding electrode 31 enters from the antenna connecting land 8, and enters the antenna land 25 from the antenna connecting land 8 at the point where the other welding electrode 32 makes contact. At this time, heat is generated at the interface between the antenna land 25 and the antenna connecting land 8 in the section where the other welding electrode 32 makes contact, whereby they are welded and alloyed or thermally fused, and joined.

If the pressure at the time of welding the antenna connecting land 8 is relatively high in comparison with the antenna land 25, the contact resistance of the welded section on the antenna connecting land 8 side becomes relatively low. Consequently, the resistance heating of the welded section on the antenna connecting land 8 side can be relatively reduced in comparison with that on the antenna land 25, and the resistance heating welding energy on the antenna connecting land 8 side can be reduced. This can prevent the antenna connecting land 8, which has a welding temperature that is relatively low in comparison with the antenna land 25, from scattering during welding, and can achieve a stable joint, whereby the joining reliability and data carrier reliability can be increased.

The welding electrodes 31 and 32 are then moved in the directions of the widths W3 and W4 of the antenna connecting land 8 and the antenna land 25, and a similar procedure is employed to join them by welding at a plurality of points in the directions of their widths W3 and W4.

Using a similar procedure as that when joining the antenna connecting land 8 and the antenna land 25, the antenna connecting land 9 and the antenna land 25 are then joined by welding them at a plurality of points in the directions of their widths W3 and W4.

Thus it is possible to manufacture the inlet 30 wherein the antenna land 25 of the IC module 20 and the antenna connecting lands 8 and 9 of the antenna sheet 1 are joined by welding at a plurality of points in the directions of the widths W3 and W4.

As described above, when securing the IC module 20 to the substrate 2, the opening 7 that can store the sealing resin section 23 of the IC module 20 is formed in the antenna sheet 1, whereby the thickness of the sealing resin section 23 of the IC module 20 is absorbed into the opening 7 of the substrate 2, enabling the inlet 30 to be made thinner.

Furthermore, by arranging the pair of welding electrodes 31 and 32 in separation on the antenna land 25 in the directions of the widths W3 and W4 direction, and welding the antenna land 25 to the antenna connecting lands 8 and 9 by resistance welding, a larger joining area can be achieved than when joining a conventional wire-wound antenna coil using ultrasound welding and the like.

Also, by arranging the pair of welding electrodes 31 and 32 in separation in the length L direction of the IC module 20, only the other welding electrode 32 need be positioned on the antenna land 25. This enables the antenna land 25 to be made smaller.

When connecting the antenna land 25 to the antenna connecting lands 8 and 9, by welding them at a plurality of points in the width W3 and width W4 directions and joining them together, the antenna land 25 and the antenna connecting lands 8 and 9 can be fixed at a plurality of points. This can increase joining strength between the antenna land 25 of the IC module 20 and the antenna connecting lands 8 and 9 of the antenna sheet 1 with respect to flexing.

When welding the antenna land 25 and the antenna connecting lands 8 and 9, since the antenna connecting lands 8 and 9 which are filmy and have an increased width W3 are welded to the antenna land 25, there is no constriction during connecting as there is in a conventional wire-wound antenna coil. Therefore, breakage of the antenna coil 4 can be prevented.

Furthermore, since the length L3 of the antenna connecting lands 8 and 9 is larger than the length of the antenna land 25 extending in the length L direction, the supporting area of the IC module 20 and the substrate 2 that is supported by the antenna connecting lands 8 and 9 can be increased. This increases durability against stress, and can prevent breakage of the antenna coil 4 even when flexing acts on the antenna connecting lands 8 and 9.

Furthermore, the reinforcing patterns 12 and 13 are formed in formation regions of the antenna connecting lands 8 and 9 on a face of the substrate 2 of the antenna sheet 1 that is on the side opposite to the face where the antenna connecting lands 8 and 9 are formed. Consequently, heat during resistance welding can be transmitted to the reinforcing patterns 12 and 13, and released to the outside. This can prevent the substrate 2 from overheating and melting. Therefore, dirt can be prevented from sticking to the resistance welding apparatus and the product, and, in addition, decrease in the flexural strength of the antenna sheet 1 can be prevented.

Furthermore, since the inlet 30 includes the antenna sheet 1 described above, breakage of the antenna coil 4 due to the antenna sheet 1 can be prevented, increasing the reliability of data communications, and further increasing the productivity of the inlet 30. It is therefore possible to provide the inlet 30 that enables breakage of the antenna coil 4 to be prevented, has high data communications reliability, and high productivity.

As described above, according to this embodiment, it is possible to provide the antenna sheet 1 that prevents breakage of the antenna coil 4, increases reliability, and also increases productivity. Moreover, by including this antenna sheet 1, it is possible to provide the inlet 30 that enables breakage of the antenna coil 4 to be prevented, has increased reliability, and increased productivity.

<Second Embodiment>

Subsequently, referring to FIG. 1A to FIG. 3B, FIG. 4B to 5B, and FIG. 6, a second embodiment of the present invention will be explained. An antenna sheet 1A of this embodiment differs from the antenna sheet 1 described in the first embodiment in that slit holes 18 are formed in the antenna connecting lands 8 and 9. Since the other features are similar to those of the first embodiment, like reference numerals are appended to like parts, and these are not repetitiously explained.

Figure 6:
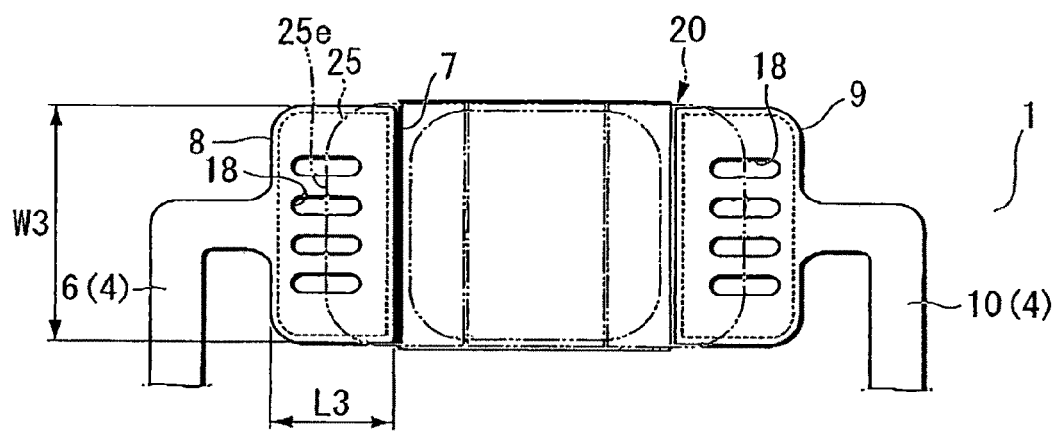
FIG. 6 is an enlarged plan view of an antenna sheet and an inlet according to a second embodiment of the present invention.

As shown in FIG. 6, slit holes 18 are provided in the antenna connecting lands 8 and 9 of the antenna sheet IA, and extend along the length L3 direction of the antenna connecting lands 8 and 9. A plurality of the slit holes 18 are formed in the width W3 direction of the antenna connecting lands 8 and 9. The slit holes 18 are formed such that, when the antenna connecting lands 8 and 9 are joined to the antenna land 25 of the IC module 20, the edges 25e of the antenna land 25 are in the middles of the slit holes 18.

In the antenna sheet 1A formed in this manner, if the joint section between the antenna connecting lands 8 and 9 and the antenna land 25 is subjected to flexing and the like, and cracks occur in the width W direction due to the edges 25e of the antenna land 25 making contact with the antenna connecting lands 8 and 9, when the cracks reach the slit holes 18, there is communication between the cracks traveling in the width W direction and the slit holes 18 extending in the length L3 direction, stopping the progression of the cracks in the width W direction.

Therefore, the cracks can be prevented from crossing the slit holes 18 and progressing in the width W direction of the antenna connecting lands 8 and 9, and breakage of the antenna coil 4 can be prevented.

Furthermore, since a plurality of the slit holes 18 are formed in the width W direction of the antenna connecting lands 8 and 9, when a crack has progressed beyond an outer-side slit hole 18, another slit hole 18 adjacent thereto can prevent further progression of that crack.

<Third Embodiment>

Subsequently, referring to FIG. 1 A to FIG. 5B, and FIG. 7A to FIG. 7C, a third embodiment of the present invention will be explained. Antenna sheets 1B to 1D of this embodiment differ from the antenna sheet 1 described in the first embodiment in that through holes 19B to 19D are formed in the substrate 2. Since the other features are similar to those of the first embodiment, like reference numerals are appended to like parts, and these are not repetitiously explained.

Figure 7A:
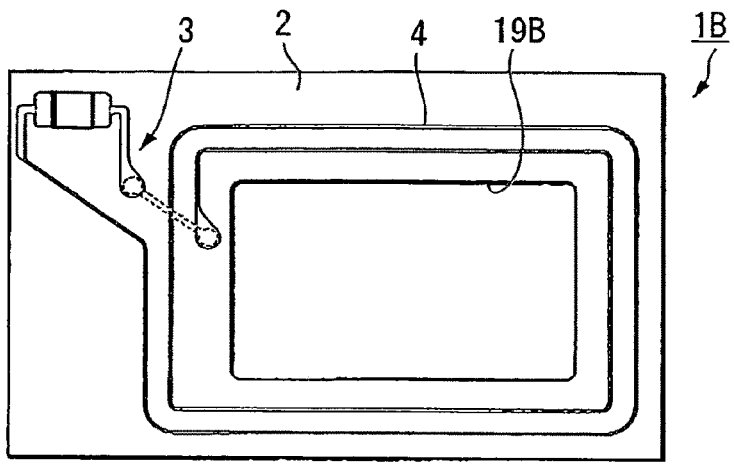
FIG. 7A is a plan view of an antenna sheet and an inlet according to a third embodiment of the present invention.
Figure 7B:
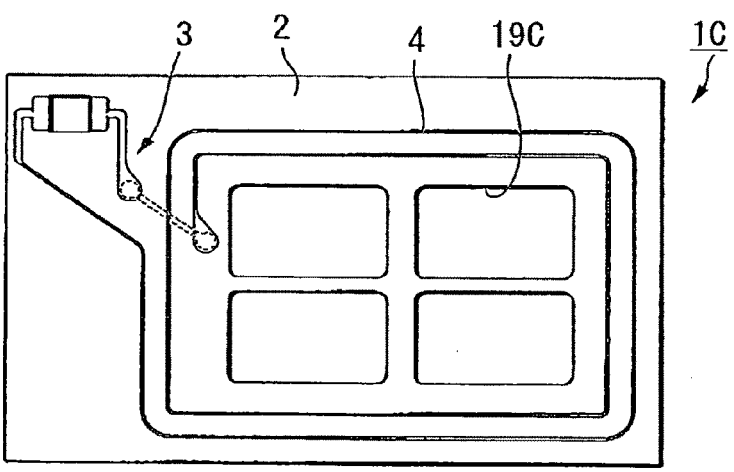
FIG. 7B is a plan view of an antenna sheet and an inlet according to the third embodiment of the present invention.
Figure 7C:
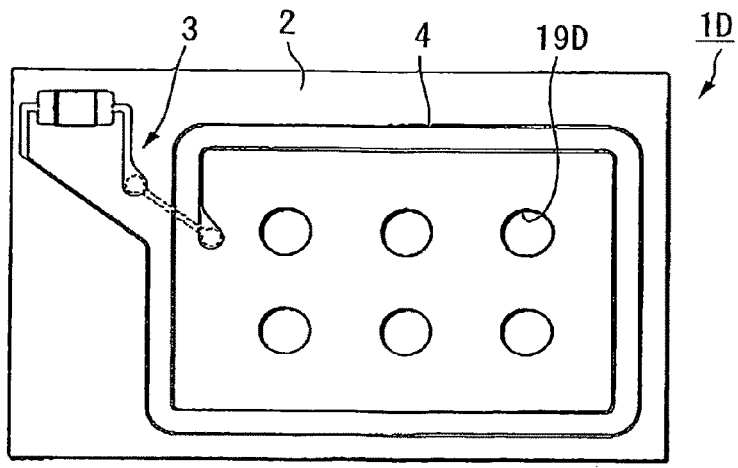
FIG. 7C is a plan view of an antenna sheet and an inlet according to the third embodiment of the present invention.

As shown in FIG. 7A, in the antenna sheet 1B, a roughly rectangular through hole 19B is formed in a region of the substrate 2 where the antenna coil 4 is not formed, and penetrates the substrate 2. As shown in FIG. 7B, in the antenna sheet 1C, a plurality of roughly rectangular through holes 19C are formed in the region of the substrate 2 where the antenna coil 4 is not formed, the substrate 2 being formed in a lattice shape. As shown in FIG. 7C, in the antenna sheet 1D, a plurality of roughly circular through holes 19D are formed in rows in the region of the substrate 2 where the antenna coil 4 is not formed.

When the through holes 19B to 19D are formed in this manner in the substrates 2 of the antenna sheets 1B to 1D, it becomes possible, when bonding base materials (explained later) to both sides of the antenna sheets 1B to 1D, to join the base materials via the through holes 19B to 19D. This can prevent peeling of the base materials from the antenna sheets 1B to 1D. The through holes 19B to 19D increase the flexibility of the antenna sheets 1B to 1D, make them lighter, and enable the quantity of material used for the substrate 2 to be reduced.

(Inlay)

Subsequently, referring to FIG. 8A and FIG. 8B, an inlay 40 including the inlet 30 described in the above embodiment will be explained.

Figure 8A:
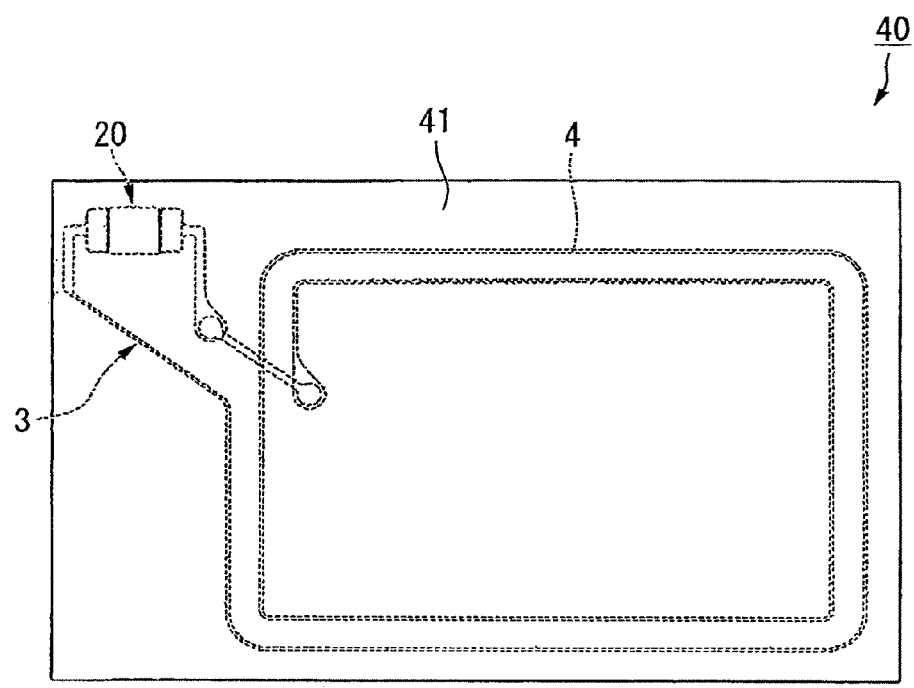
FIG. 8A is a plan view of an inlay according to an embodiment of the present invention.
Figure 8B:
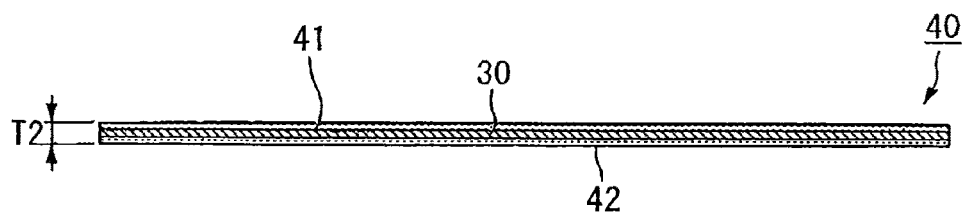
FIG. 8B is a front view of an inlay according to the embodiment of the present invention.

As shown in FIGS. 8A and 8B, an inlay 40 includes the inlet 30 described in the above embodiment, and a pair of base materials 41 and 42 that pinch the inlet 30. The inlay 40 is formed to a desired thickness T2 by pinching the inlet 30 between the base materials 41 and 42 and joining them into a single piece by lamination.

A porous base material, a base material having a fibrous structure, or the like, is used as the base materials 41 and 42. For example, an insulating plastic film (PET-G: noncrystalline copolyester, PVC: vinyl chloride resin, etc.), or an insulating synthetic sheet (Teslin {Registered trademark}, a polyolefin synthetic sheet manufactured by PPG Industries), or Yupo {Registered trademark} a polypropylene synthetic sheet manufactured by Yupo Corporation) is used.

Since the inlay 40 includes the inlet 30 including the antenna sheet 1 described in the first embodiment, the antenna sheet 1 can prevent breakage of the antenna coil 4, the reliability of data communication can be increased, and productivity can be increased. Furthermore, the base materials 41 and 42 can reinforce the points of connection between the antenna connecting lands 8 and 9 of the antenna sheet 1 and the antenna land 25 of the IC module 20.

It is therefore possible to provide the inlay 40 wherein breakage of the antenna coil 4 is prevented, and which achieves high reliable data communication, and high productivity.

When the inlet 30 including the antenna sheets 1B to 1D with the through holes 19B to 19D, described in the third embodiment, is used in the inlay 40, the base materials 41 and 42 can be joined together via the through holes 19B to 19D. This can increase the joint strength of the inlet 30 to the base materials 41 and 42, and prevent peeling of the base materials 41 and 42 from the inlet 30.

When the base materials 41 and 42 are forcedly peeled off, due to difference in the joint strengths of the section where they were joined together and the section where they were joined to the inlet 30, the inlet 30 is broken by the peeling of the base materials 41 and 42. This can prevent unauthorized modification of the inlay 40.

By forming the through holes 19B to 19D in the antenna sheet 1, the flexibility of the inlay 40 can be increased, the inlay 40 can be made lighter, and the quantity of material used for the substrate 2 of the antenna sheet 1 can be reduced.

(Method of Manufacturing the Inlay)

Subsequently, a method of manufacturing the inlay 40 will be explained.

Firstly, the inlet 30 is pinched between the pair of base materials 41 and 42, and joined to them.

When the synthetic sheets mentioned above are used as the base materials 41 and 42, the inlet 30 is joined to the base materials 41 and 42 using an adhesive laminating method of applying an adhesive to the antenna sheet 1, or to the faces of the base materials 41 and 42 that contact the antenna sheet 1, and joining them at a relatively low temperature of, for example, approximately 70° C. to 140° C.

As the adhesive, for example, EVA (ethylene vinyl acetate resin)-based, EAA (ethylene-acrylic acid copolymer resin)-based, polyester-based, polyurethane-based, and the like, can be used.

Instead of applying an adhesive coating, an adhesive sheet that uses the resin used in the adhesives mentioned above can be pinched between the antenna sheet 1 and the base materials 41 and 42.

When using the thermoplastic film mentioned above as the base materials 41 and 42, the inlet 30 is joined to the base materials 41 and 42 using a thermal laminating method of melt-bonding them by applying pressure to them while heating them at a temperature that exceeds the softening temperature of the base materials 41 and 42, e.g. approximately 130° C. to 170° C. To accomplish reliable melt-bonding, the adhesive mentioned above can also be used when employing the thermal laminating method.

After the inlet 30 is joined to the base materials 41 and 42 to form a single piece, the outer shape of this single piece is shaped as desired.

Thus the inlay 40 shown in FIG. 8A and FIG. 8B can be manufactured.

Here, the softening temperature of the base materials 41 and 42 is approximately 100° C. to 150° C. for PET-G, and approximately 80° C. to 100° C. for PVC.

As described in the first embodiment, the substrate 2 of the antenna sheet 1 is made from PEN or PET. The softening temperature of PEN is approximately 269° C., and the softening temperature of PET is approximately 258° C. That is, in comparison with a thermoplastic material having a low softening point such as PET-G, which was used for substrates in conventional antenna sheets, the heat-resistance temperature of the substrate 2 can be increased.

Accordingly, when the base materials 41 and 42 and the inlet 30 are heated to approximately 130° C. to 170° C., the base materials 41 and 42 soften, whereas the substrate 2 of the antenna sheet 1 does not. Thus, when the inlet 30 including the antenna sheet 1 and the base materials 41 and 42 are laminated and joined by thermal lamination, even if heat is applied to the substrate 2 of the antenna sheet 1, the substrate 2 can be prevented from plasticizing and flowing. Therefore, the antenna coil 4 can be prevented from moving in accordance with the flow of the substrate 2, and the reliability of data communication can be increased.

Even if the substrate 2 is heated in excess of its softening temperature such that it is plasticized by the heat and flows, since the antenna coil 4 is formed in a film shape as described above, in comparison with a conventional wire-wound antenna coil, there is a larger contact area of the antenna coil 4 with the substrate 2, whereby the flow resistance of the antenna coil 4 can be increased. Therefore, it is possible to prevent the antenna coil 4 from moving according to the flow of the substrate 2, and to improve the reliability of data communication.

(Method of Mass-producing Antenna Sheet, Inlet, and Inlay)

Subsequently, a method of mass-producing the antenna sheet 1, the inlet 30, and the inlay 40 described above will be explained. The following explanation centers on a mass-production method, and will not explain other steps. For steps other than the mass-production method, publicly known manufacturing methods can be used.

Figure 9A:
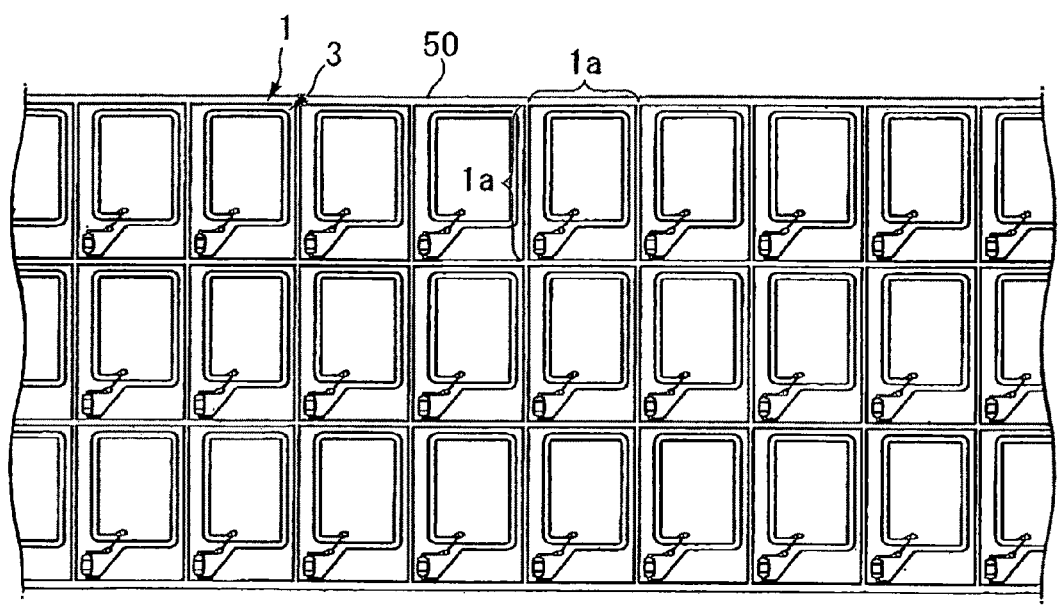
FIG. 9A is an explanatory plan view of a manufacturing method of an antenna sheet according to the embodiment of the present invention.

As shown in FIG. 9A, aluminum thin films are collectively formed on a substrate sheet 50 with a plurality of formation regions for antenna sheets 1 arranged thereon in a matrix. The formed aluminum thin films are then collectively patterned, and an antenna circuit 3 is formed in each formation region 1a. In a similar manner to the antenna circuit 3, jumper wires 14 and reinforcing patterns 12 and 13 (see FIG. 1B) are collectively formed in each formation region 1a on the rear face of the substrate sheet 50 in relation to the face where the antenna circuit 3 is formed.

Subsequently, terminal sections 5 and terminal sections 11 of the antenna coil 4 of the antenna circuit 3 are collectively connected to terminal sections 15 and 16 of the jumper wires 14. Openings 7 for storing the sealing resin sections 23 of the IC modules 20 are collectively provided in the formation regions 1a. The antenna sheets 1 that were collectively formed in the plurality of formation regions 1a on the substrate sheet 50 are then cut and separated as individual antenna sheets 1.

Thus a large quantity of the antenna sheets 1 can be collectively mass-produced, and productivity of manufacturing the antenna sheets 1 can be increased.

The IC module 20 is mass-produced in parallel with the mass-production of the antenna sheets 1.

Figure 9B:
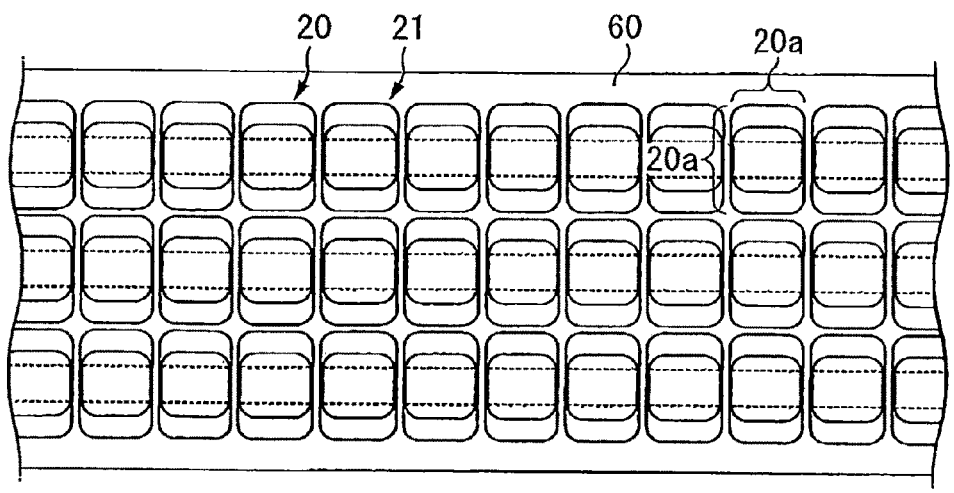
FIG. 9B is an explanatory plan view of a manufacturing method of an IC module according to the embodiment of the present invention.

As shown in FIG. 9B, lead frames 21 are collectively formed in formation regions 20a on a metal tape 60 where a plurality of formation regions 20a for IC modules 20 are arranged in a matrix. IC chips 22 are then collectively mounted on die pads 24 of the lead frames 21 in the formation regions 20a, and input/output pads of the IC chips 22 are collectively connected by bonding wires to the antenna lands 25 (see FIG. 3B). Sealing resin sections 23 are formed collectively in each of the formation regions. The IC modules 20 collectively formed in the formation regions 20a of the metal tape 60 are then cut and separated as individual IC modules 20.

While the sealing resin section 23 of each separated IC module 20 is stored in the opening 7 of each separated antenna sheet 1, the antenna sheets 1 and the IC modules 20 are joined by resistance welding as described above.

Thus, the inlets 30 can be collectively mass-produced, and their manufacturing productivity can be increased.

Figure 10:
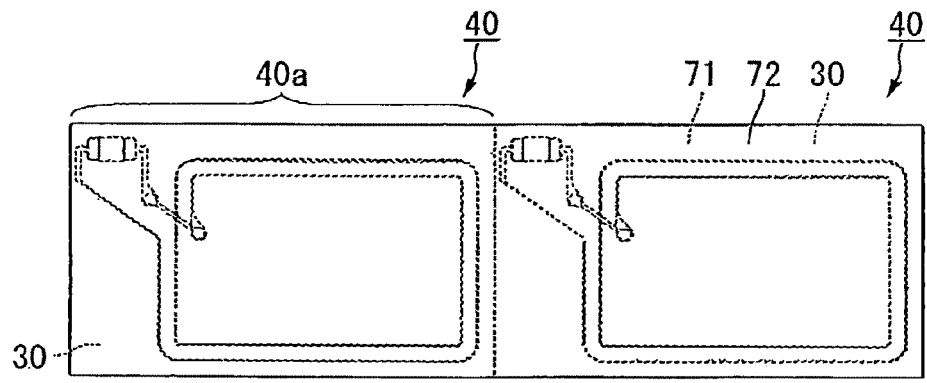
FIG. 10 is an explanatory plan view of a manufacturing method of an inlay according to the embodiment of the present invention.

Subsequently, as shown in FIG. 10, a plurality of formation regions 40a for inlays 40 are provided on a first base-material sheet 71 and on a second base-material sheet 72. Inlets 30 are provided in each of the formation regions 40a of the first base-material sheet 71. The second base-material sheet 72 is then arranged on the inlets 30 such that the formation regions 40a of the first base-material sheet 71 and the formation regions 40a of the second base-material sheet 72 overlap.

As in the method of manufacturing the inlay 40 described above, the base-material sheets 71 and 72 are joined to the inlet 30 using a joining method that is suitable for the material quality of the base-material sheet 71. The inlays 40 formed collectively in the formation regions 40a are then cut as required, with a plurality of inlays 40 linked together or with separated individual inlays 40.

In this manner, the inlays 40 can be collectively mass-produced, and their manufacturing productivity can be increased.

(Electronic Passport)

Subsequently, an electronic passport 100 will be explained as one example of a data carrier with non-contact type IC.

Figure 11:
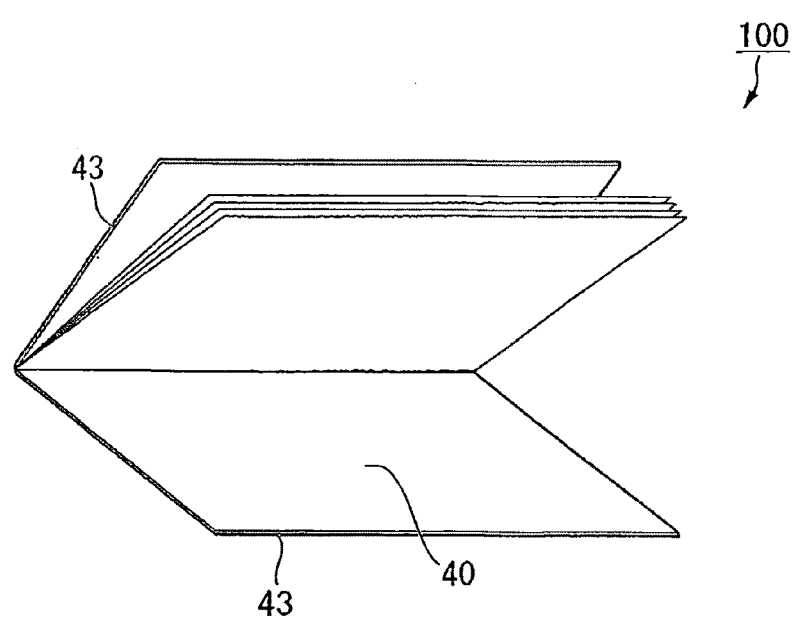
FIG. 11 is a perspective view of a schematic configuration of an electronic passport according to the embodiment of the present invention.

As shown in FIG. 11, an electronic passport 100 includes the inlay 40 described above as its front cover. A cover material 43 is joined to one face of the inlay 40 and becomes the front cover of the electronic passport 100.

When the cover material 43 is joined to the inlay 40 in this manner, the external appearance and texture of the wire 10 including the inlay 40 can be made similar to a conventional passport. Also, since the inlay 40 includes the antenna sheet 1 described above, it is possible to provide the electronic passport 100 wherein breakage of the antenna coil 4 can be prevented, and which has high reliability of data communication and high productivity.

The present invention is not limited to the embodiment described above. For example, the shape of the antenna coil need not be rectangular. The number of winds of the antenna coil 4 is also not limited to the embodiment described above. With regard to the material quality of the antenna circuit, it can be made from a material other than aluminum, such as, for example, gold, silver, or copper.

Since the terminal section 25 of the IC module 20 is often made from copper, when the antenna coil 4 is formed from copper, the connection section 8 of the antenna coil 4 and the terminal section 25 of the IC module 20 can be formed from the same metal, increasing the joint performance between the connection section 8 and the terminal section 25.

Figure 12:
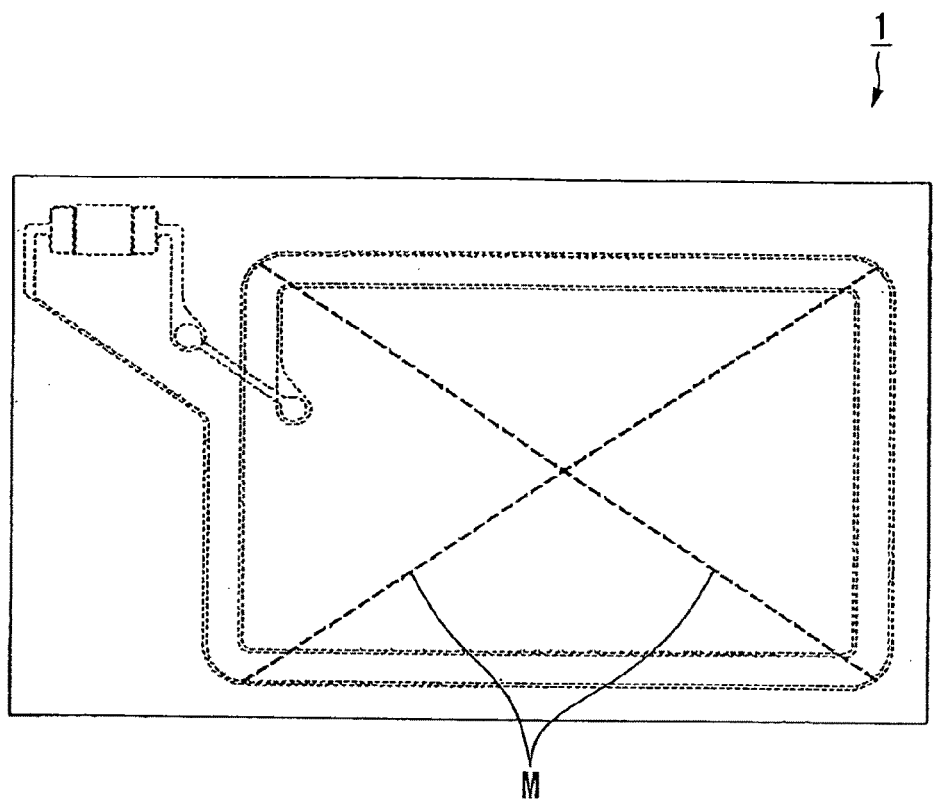
FIG. 12 is a plan view of a deformation example of an antenna sheet according to the embodiment of the present invention.

As shown in FIG. 12, perforations M can be formed in the antenna sheet 1. After the inlet has been pinched between the base materials and joined to them, when the base materials are attempted to be peeled from the inlet, stress concentrates in the perforations M in the antenna sheet 1, whereby the antenna sheet 1 is cut along the perforations M, and the antenna sheet 1 breaks. Therefore, unauthorized modification of the data carrier with non-contact type IC can be prevented.

When using an adhesive material to join the inlet to the base materials, the adhesive can be applied in a predetermined pattern, such that the joint strength of the inlet and the base materials is made non-uniform. Consequently, when the base materials are attempted to be peeled from the inlet, a non-uniform stress acts on the antenna sheet, cutting and breaking the antenna sheet. Therefore, unauthorized modification of the data carrier with non-contact type IC can be prevented.

It is possible to form the slit holes, which extend in the length direction of the antenna connecting land, in only one point in the width direction. This can increase the connection area between the antenna connecting land and the antenna land.

The opening in the substrate of the antenna sheet need not be formed. Furthermore, the position of the opening is not limited to that described in the embodiment. For example, the opening can be formed along one side of the substrate. The entire IC module can be stored in the opening. The shape of the opening can be formed freely in accordance with the shape of the IC module to be stored in it.

Base material openings for storing at least a part of the IC module can be formed in the base materials that pinch the inlet, at roughly the same position as the opening in the antenna sheet. Consequently, when pinching the inlet between the base materials, at least a part of the IC module can be stored in the base material openings, whereby the thickness of that section can be absorbed by the base materials, and the inlay can be made thin.

When the antenna sheet 1 shown in FIG. 4B is pinched between a pair of base materials and made into a product, a storing section (an opening or a recess) having roughly the same shape as the antenna land 25 when viewed from above can be provided in the base material to be attached to the antenna land 25 side, and the antenna land 25 can be stored in this storing section. A storing section (an opening or a recess) having roughly the same shape as the sealing resin of the IC chip 22 when viewed from above can be provided in the base material to be attached to the opposite side to the antenna land 25 side, and the sealing resin of the IC chip 22 can be stored in this storing section.

With this configuration, when the antenna sheet 1 is pinched between a pair of base materials and made into a product, the thickness of the product can be reduced, and the antenna sheet 1 can be more reliably fixed by the pair of base materials.

The joint section between the antenna connecting land and the antenna land of the module, which are joined by resistance welding, can be covered with epoxy resin, urethane resin, and the like. This can increase the reliability, vibration resistance, impact resistance, abrasion resistance, and the like, of the joint section.

While the embodiment describes an electronic passport as an example of a data carrier with non-contact type IC including an inlay, the inlay of the present invention can also be used in, for example, electronic identification documents and various types of electronically confirmable activity history documents.

When the inlet of the present invention is applied in, for example, a card type data carrier with non-contact type IC, such as a commuter pass with an IC or an electronic money card, the antenna sheet including the inlet can prevent breakage of the antenna coil of the commuter pass with an IC, the electronic money card, and the like, increasing the reliability of data communication and increasing productivity.

<Fourth Embodiment>

A non-contact type information medium (hereinafter abbreviated as 'information medium') according to a fourth embodiment of the present invention will be explained based on the drawings.

Figure 13:
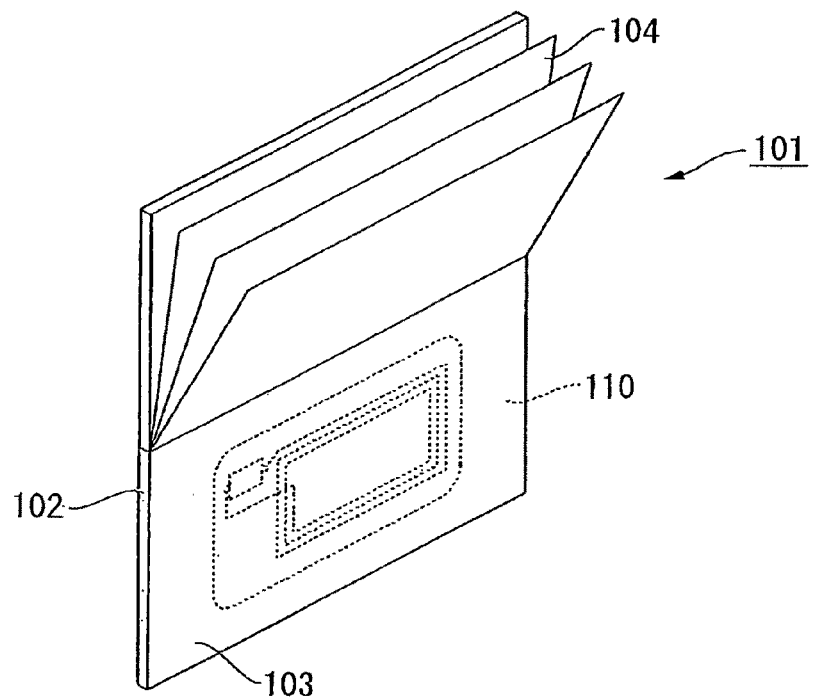

FIG. 13 is a perspective view of a booklet 101 including an information medium 110 of this embodiment. The information medium 110 is affixed while being pinched between one of two cover members 102, which constitute a front cover and a rear cover of the booklet 101, and an inner bonding sheet 103 that is bonded to that cover member 102. A plurality of text sheets 104 are bound between the front cover and the rear cover, enabling the booklet 101 to be used for various purposes such as a savings passbook.

Incidentally, the information medium 110 can be attached to face of one of the cover members 102 of the booklet 101. In this case, the information medium 110 is preferably attached to the inner face of the cover member 102 (the face where the cover members 102 touches the text sheets 104), rather than to its outer face. This configuration can protect the information medium 110 from external collisions against the booklet 101.

Alternatively, the information medium 110 can be attached to one of the pages of the text sheets 104 of the booklet 101. For example, a predetermined page of the text sheets 104 is given a larger area than the other pages, and folded such that its area becomes the same as the other pages, enabling the information medium 110 to be stored in a space formed by the folded section. The folded section is sealed by a method such as gluing or stitching.

Figure 14:
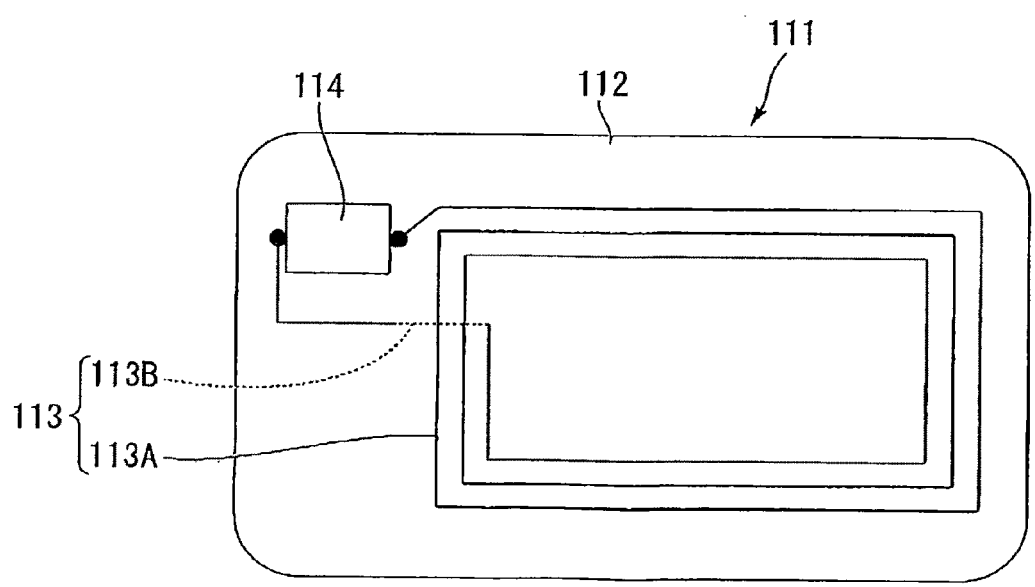
FIG. 14 is a view showing a mold of an IC inlet of the same non-contact type information medium.

FIG. 14 is a view showing a mold of an IC inlet 111 that constitutes a part of the information medium 110. The IC inlet 111 includes an insulating sheet 112, an antenna coil 113 formed on both sides of the sheet 112, and an IC chip 114 attached to the sheet 112.

Various types of resin such as polyethylene terephthalate (PET) can suitably be used as the material for the sheet 112. The antenna coil 113 is formed by a method such as etching, wire bonding, or printing, using a conductor such as aluminum or silver. Of these, aluminum is inexpensive, making it preferable when considering the manufacturing cost. The antenna coil 113 includes an antenna loop 113A provided on one face of the antenna coil 113, and a jumper wire 113B provided on another face. The end of the jumper wire 113B is electrically connected to the antenna loop 113A via a through hole (not shown) provided in the sheet, or by a method such as crimping.

The IC chip 114 is electrically connected to the antenna coil 113 by welding or the like, and attached to the sheet 112. This enables the IC inlet 111 to transmit and receive data to/from an external data reading device and such like in a non-contact manner.

Figure 15:
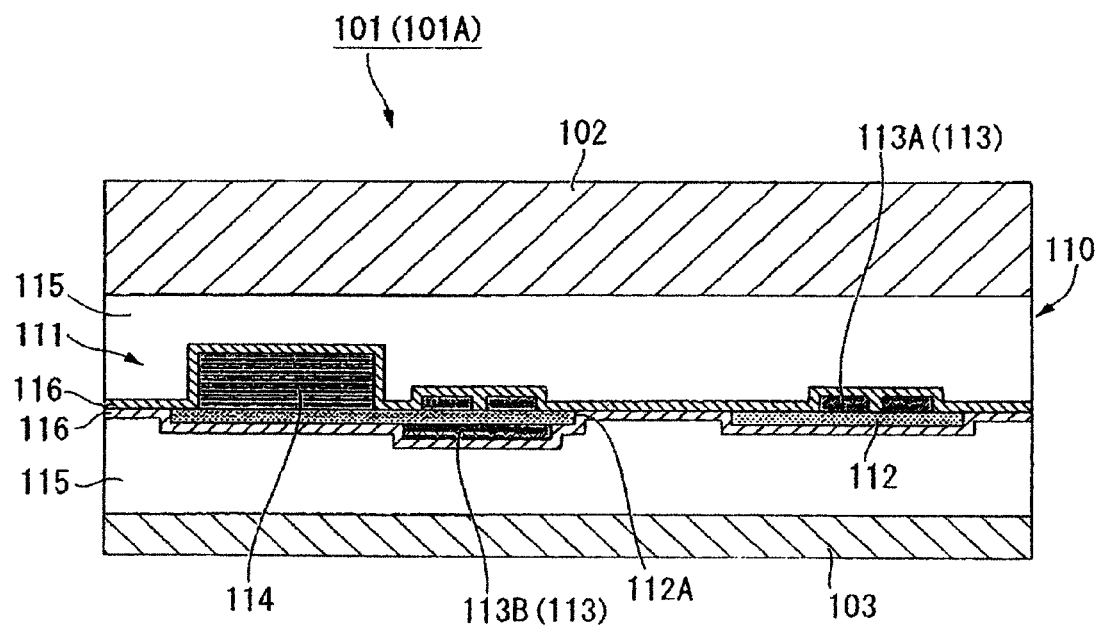
FIG. 15 is a cross-sectional view of the same non-contact type information medium attached to the same booklet 101.

FIG. 15 is a cross-sectional view of an information medium 110 attached to a booklet 101. The information medium 110 is formed by using two sheet-like porous base materials 115 to pinch an IC inlet 111 from above and below. The IC inlet 111 and the porous base materials 115 are joined in a single piece by an adhesive 116.

In consideration of a manufacturing step of the information medium 110 described below, the porous base materials 115 should preferably have thermoplasticity. Specifically, a base material can be obtained using a resin such as polyethylene, polypropylene, polyvinyl chloride, polyvinylidene chloride, polystyrene, polyvinyl acetate, polyester, or a combination of such resins, which is then subjected to a process such as mixing with porous particles such as silica, foaming by the addition of air during kneading, and stretching followed by punching. Since this type of base material is commercially available as resin sheet and synthetic paper in which print suitability is given to an inkjet, an offset, and the like, these can be used.

Similarly, the adhesive 116 is preferably hot-melting. Specifically, adhesives made from various types of thermoplastic resin, such as an ethylene-vinyl acetate copolymer (EVA)-based, ethylene-acrylic acid copolymer (EAA)-based, ethylene methyl acrylic acid copolymer (EMAA)-based, polyester-based, polyamide-based, polyurethane-based, and olefin-based, can suitably be used.

A substance that is resistant to chloride ions is mixed into the adhesive 116, and prevents the permeation of chloride ions. That is, the layer that includes the adhesive 116 also functions as a chloride ion-resistant layer, which covers the antenna coil 113 formed on the IC inlet 111 and prevents the chloride ions from contacting the antenna coil 113, thereby preventing deterioration such as corrosion. Such an adhesive 116 can easily be obtained by adding an epoxy-based cross-linking agent to an EAA-based aqueous emulsion adhesive, or by using a gravure coater to apply an acrylic emulsion adhesive and the like according to a predetermined coating thickness, etc.

To form a chloride ion-resistant layer using the adhesive 116, in addition to the material quality, consideration must also be given to the thickness of the layer formed by the adhesive 116. Tests were carried out to clarify the relationship between these.

Methods used in the tests will be explained.

(Test Samples)

Using a 'TESLIN Sheet' (a product manufactured by PPG Industry; thickness=380 μm) as porous base materials, an IC inlet having an aluminum antenna coil was pinched and affixed onto a sheet made from PET.

As the adhesive, three types of conventional adhesives were used: an EMAA-based adhesive, an EMAA-based adhesive containing an epoxy-based cross-linking agent, and an acrylic-based adhesive 116; the coating thicknesses and additive quantities were varied. These samples were used in a salt water spray test described below.

Samples were also created in which each of the adhesives complying with these conditions was applied directly to the IC inlet without pinching it between porous base materials, and these samples were used in a hydrochloride test described below.

(Test 1: Salt Water Spray Test)

A salt water spray test was conducted in compliance with ISO10373-1, and the results were evaluated in the following three stages.

A: No corrosion whatsoever, B: Partial corrosion, C: Total corrosion and defective performance.

(Test 2: Hydrochloride Test)

A uniquely set testing method, performed according to the following procedures.

(1) One drop of 2N hydrochloride (HCl) was dropped onto each sample, obtained by applying each type of adhesive directly to an IC inlet, which was then covered from above with a film of PET so that it did not dry.
(2) Each sample was then put into an 80° C. oven, and the time taken for the aluminum to melt was measured.

Table 1 shows results obtained for each sample in Test 1 and Test 2.

TABLE 1

| Adhesive | Coating Thickness | Test 1 | Test 2 |
|---|---|---|---|
| EMAA-based thermoplastic adhesive | 4 μm | C | 1 minute |
| EMAA-based thermoplastic adhesive | 8 μm | C | 2 minutes |
| EMAA-based thermoplastic adhesive | 12 μm | B | 4 minutes |
| EMAA-based thermoplastic adhesive + epoxy-based cross-linking agent 1% | 4 μm | B | 3 minutes |
| EMAA-based thermoplastic adhesive + epoxy-based cross-linking agent 5% | 4 μm | A | 10 minutes |
| Acrylic-based thermoplastic adhesive | 4 μm | B | 3 minutes |
| Acrylic-based thermoplastic adhesive | 8 μm | A | 8 minutes |

As shown in Table 1, the results of Test 1 and Test 2 indicated a consistently good correlation. The samples that were joined using only an EMAA-based thermoplastic adhesive in the conventional manner could not obtain sufficient durability against the salt water spray, even when the thickness of the adhesive coating was increased.

In contrast, when an epoxy-based cross-linking agent is added to the EMAA-based thermoplastic adhesive, the adhesive becomes resistant to chloride ions. Durability was enhanced by increasing the mixture ratio of the epoxy-based cross-linking agent.

Furthermore, the acrylic-based adhesives had greater durability against salt water spray than the EMAA-based adhesives, and were resistant to chloride ions. Their chloride ion resistance was increased by making the coating thicker.

The above results indicate that, by adjusting the mixture ratio of a substance that is resistant to chloride ions, or by selecting an adhesive made from a material that is resistant to chloride ions and adjusting its coating thickness, it is possible to form a chloride ion-resistant layer having a desired resistance to chloride ions.

A method of manufacturing the information medium 110 configured as described above will be explained.

Firstly, an antenna coil 113 is made by providing an antenna loop 113A and a jumper wire 113B on a sheet 112. An IC chip 114 is connected the antenna coil 113 to form an IC inlet 111. Up to this point, the method is similar to a conventional method for manufacturing an IC inlet.

Figure 16:
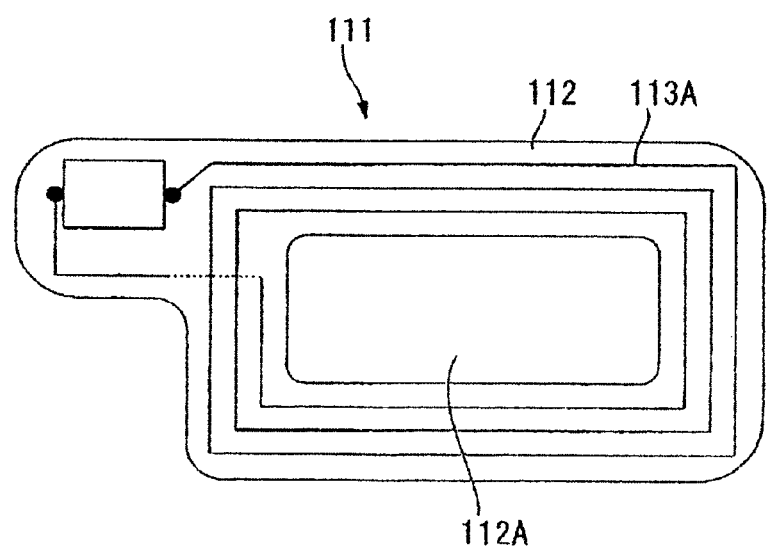
FIG. 16 is a view showing a cut state of the same IC inlet when manufacturing the same non-contact type information medium.

As shown in FIG. 16, to achieve a good joint between the IC inlet 111 and porous base materials 115, the periphery of the sheet 112 is cut away; in addition, a region of the sheet 112 that is inside the antenna loop 113A is removed, forming a through hole 112A which penetrates in the thickness direction of the sheet 112.

The through hole 112A can be suitably formed using a punching mold. Therefore, even in cases such as when IC inlets are mass-produced by forming a great many antenna coils on a single large sheet, punching enables a great many through holes to be easily made.

With regard to achieving a good joint with the porous base materials, the size of the through hole 112A is preferably set such that the area of a cross-section orthogonally intersecting the thickness direction of the through hole 112A occupies 60% or more of the region enclosed within the innermost antenna of the antenna loop 113A. With regard to the same point, the area of the sheet 112 is preferably set at not less than 3% and less than 20% of the area of the porous base material 115 it is joined to.

One face of each of the two porous base materials 115 formed with a desired size is coated with an adhesive 116 which has been made resistant to chloride ions in the manner described above. The faces coated with the adhesive 116 are arranged opposite the IC inlet 111, which is then pinched and pressed by the porous base materials 115 from above and below. In this manner, a chloride ion-resistant layer including the adhesive 116 is formed such as to cover the antenna coil 113.

When the porous base materials 115 are made from thermoplastic resin, if heat is applied at the same time as applying pressure, the porous base materials 115 soften and deform, whereby projections and recesses on the surface of the IC inlet 111 due to the IC chip 114 and the like are absorbed by the porous base materials 115. As a result, an information medium 110 having flat top and bottom faces can be obtained.

A conventional method of manufacturing an IC card and the like can be used in the above process, which can be executed using, for example, a hot press.

As shown in FIG. 15, the information medium 110 thus obtained is pinched between the front cover member 102 and the inner bonding sheet 103, and, when these are all joined in a single piece using an adhesive (not shown), the booklet 101 including the information medium 110 can be obtained.

The porous base materials 115 that constitute the outer faces of the information medium 110 have good close attachment to various types of adhesive, and can therefore be excellently joined without problems, even when using a water-based emulsion adhesive and the like used in conventional booklet joining. Furthermore, since the outer faces of the information medium 110 are flatly formed without projections and recesses, the information medium 110 can be attached without spoiling the external appearance of the booklet 101.

When joining the cover members 102 to the information medium 110, it is preferable to use a reaction curing type adhesive with no volume change. When a dry curing type adhesive with volume change is used, if a part of the information medium includes projections and recesses, the quantity of adhesive used will increase in the recesses. As a result, there is greater volume reduction when drying, and there are cases where the external appearance is spoiled due to a partial collapse of cover members 102 and the like which overlap the recesses.

As the adhesive with no volume change, it is possible to use, for example, a two-part mixed type epoxy-based adhesive, a moisture curing type silicon-based adhesive, a one-part curing type urethane-based adhesive, and the like. Various types of hot-melt adhesive can also be used, such as EVA-based, EAA-based, polyester-based, polyamide-based, polyurethane-based, and olefin-based. Of these adhesives, from the viewpoints of workability and durability, a reactive type hot-melt adhesive is more preferable.

Using examples, the information medium 110 and the booklet 101 of this embodiment will be further explained.

EXAMPLES

1. Creating an IC Inlet

A PET sheet having a thickness of 38 micrometers (μm) was used as the sheet 112. Aluminum deposition and printing of a mask layer having the same shape as the antenna coil 113 were performed on both faces of the sheet 112, and pattern etching was used to form an antenna loop 113A on one face and a jumper wire 113B on the other face. In addition, the antenna loop 113A and the jumper wire 113B were joined by caulking, and an IC chip 114 was welded to the connection terminal section of the antenna coil 113.

Figure 17:
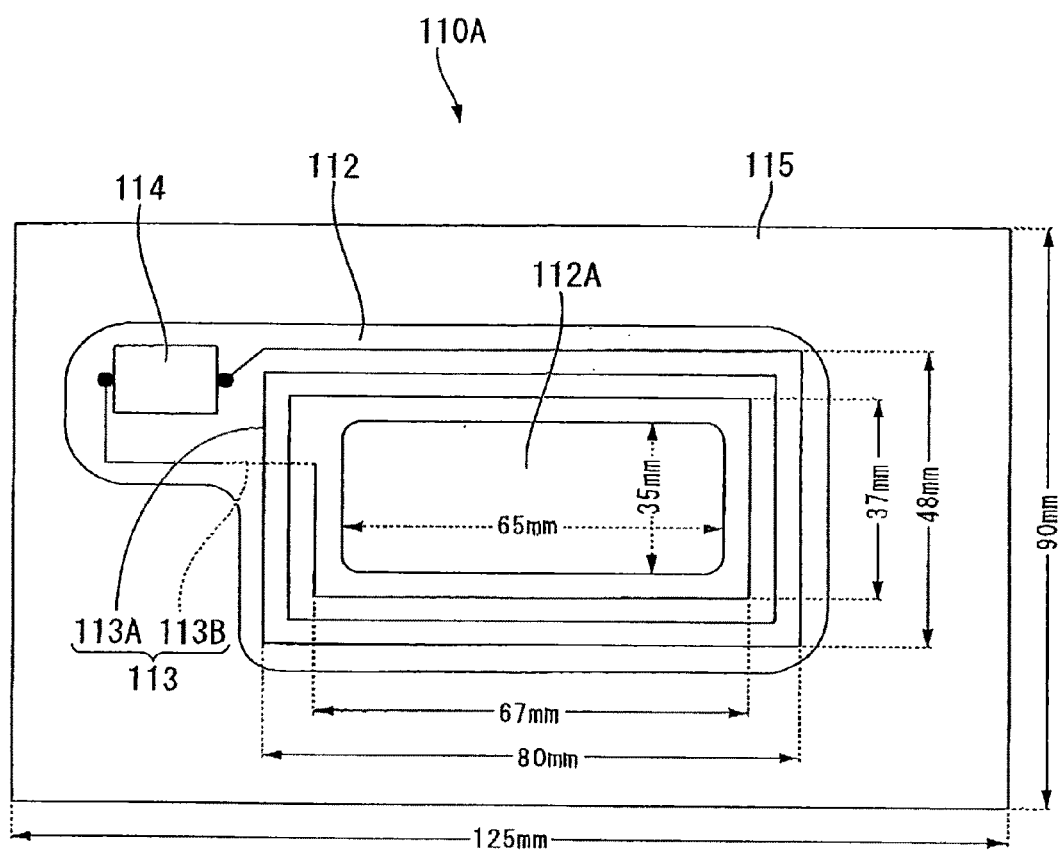
FIG. 17 is a view showing dimensions of each part of the same non-contact type information medium in an example.

FIG. 17 shows dimensions of each section of an information medium 110A in this test. The outer periphery of the roughly square antenna loop 113A is 80 millimeters (mm)× 48 mm, and its inner periphery is 67 mm×37 mm.

Subsequently, a part of the sheet 112 that is inside the antenna loop 113A was punched away to form a through hole 112A having a roughly square shape of 65 mm×35 mm. Moreover, leaving an outline that is 2 mm from the outer periphery of the antenna loop 113A and the IC chip 114, the sheet 112 that was further to the outside than that was removed by punching. The cross-sectional area orthogonal to the thickness direction of the through hole 112A thereby becomes approximately 91% of the region inside the periphery of the antenna loop 113A. In this manner the IC inlet 111 was produced.

2. Preparing the Porous Base Materials

A Teslin sheet (a product manufactured by PPG Industries; thickness: 380 μm) was used as the material for the porous base materials 115. An adhesive, obtained by mixing 1 part by weight of a soluble epoxy curing agent with 20 parts by weight of an EMAA-based aqueous emulsion adhesive (AC-3100, a product manufactured by Chuo Rika Kogyo Corporation), was applied to one face of each sheet at an amount of 5 g/m² (coating thickness: approximately 5 μm). After drying, two sheets of 150 mm×200 mm were cut, obtaining porous base materials 115. At this point in time, the area of the IC inlet 111 was 15% of the area of the porous base materials 115.

A hole corresponding in size to the lead frame of the IC chip 114 was then drilled into one of the porous base materials 115, and a hole corresponding in size to the mold of the IC chip 114 was drilled into the other porous base material 115.

3. Manufacturing the Information Medium

The IC inlet 111 and the porous base materials 115 were arranged such that the read frame and mold of the IC chip 114 were stored in the holes formed in the respective porous base materials 115. The IC inlet 111 was then laminated by pinching it from above and below by the porous base materials 115, and temporarily held by spot heating.

The porous base materials 115 and the IC inlet 111 that were temporarily held by spot heating were pinched between two stainless steel plates and subjected to heating and pressurizing to join them completely together, thereby obtaining the information medium 110A. The heating and pressurizing conditions were adjusted as appropriate between a heater unit temperature of 100° C. to 160° C., pressure of 5 KgF/cm² to 30 KgF/cm², and a processing time of 15 seconds to 120 seconds.

4. Attachment to the Booklet

A cloth for book cover (Enviromate H, a product manufactured by ICG Holliston) was used as the material for the cover members 102. This was cut to the same size as the information medium 110A to obtain the cover members 102.

A moisture curing hot-melt adhesive (Esdain 9635, a product manufactured by Sekisui Fuller Corp.) was melted with a heat roll coater, and an amount of 20 g/m² was applied to the cover members. The outer faces of the porous base materials 115 of the information medium 110A were affixed to the cover members 102 coated with the hot-melt adhesive, pressurized with rollers, and thereafter subjected to an aging process.

Subsequently, a plurality of text sheets 104 and one inner bonding sheet 103 are collated, and their centers are stitched using a sewing machine, thereby manufacturing a text section with the inner bonding sheet 103 attached to an outermost section. A water-based emulsion adhesive (SP-2850, a product manufactured by Konishi Corp.) was then applied at an amount of 20 g/m² to the porous base materials 115 on the opposite side of the information medium 110A to the side affixed to the cover members 102, and the porous base materials 115 were affixed to the inner bonding sheet 103. The book thus obtained is opened and cut to 125 mm×180 mm, obtaining a booklet 101. That is, the dimensions of the porous base materials 115 shown in FIG. 17 are the dimensions when the booklet 101A is folded.

Comparative Example

In a comparative example, although the IC inlet 111 was made using the same method as in the example, the size of the through hole 112A was 40 mm×30 mm. The cross-sectional area orthogonal to the thickness direction of the through hole 112A was approximately 48% of the region inside the periphery of the antenna loop 113A.

Moreover, the IC inlet 111 was attached to a booklet using the same procedure as the example, to obtain a booklet having roughly the same external appearance.

The front and rear covers of the booklet 101A of the example manufactured in the manner described above are formed smoothly, no projections or recesses being generated by the attachment of the information medium 110A. Furthermore, in various durability evaluation experiments, including storing it in a high temperature and high moisture environment and subjecting it to a bend test, the IC inlet 111 suffered no deterioration, especially of the antenna coil 113, and thus achieved excellent results.

When attempting to remove only the IC inlet from the booklet of the comparative example, in the booklet of the comparative example, it was possible to separate the IC inlet from the porous base materials and remove it without breaking the antenna coil. On the other hand, in the booklet 101A of the example, when attempting to peeling away the porous base materials 115, since the porous base materials 115 are directly and firmly joined together at the through hole 112A with a large area and around the IC inlet 111, a part of the antenna coil 113 and the porous base materials 115 was broken, and the IC inlet 111 could not be removed in a usable state.

According to the information medium 110 of this embodiment, when the IC inlet 111 is pinched between the porous base materials 115, which have been coated with the chloride ion-resistant adhesive 116, and joined to them in a single piece, a chloride ion-resistant layer is formed such as to cover the antenna coil 113 including the antenna loop 113A and the jumper wire 113B. Therefore, even when the information medium 110 is attached to a booklet, chloride ions that permeate the cover members 102 and the inner bonding sheet 103 are prevented from reaching the antenna coil 113 and acting upon it, whereby deterioration of the antenna coil 113 is excellently prevented. Therefore, even when the information medium is applied in a booklet, a configuration can be accomplished where the information medium functions with high reliability for a long time period.

Furthermore, since the IC inlet 111 is pinched from above and below by the porous base materials 115, projections and recesses due to the IC chip 114 and the like are absorbed by the porous base materials 115, whereby the information medium can be configured with smooth top and bottom faces. As a result, even when the information medium 110 is applied in a booklet, the external appearance is not spoiled.

Moreover, since the through hole 112A is provided in the sheet 112 of the IC inlet 111, at the point of the through hole 112A, the porous base materials 115 are firmly affixed by the adhesive 116 without the sheet 112 in between them. Therefore, the entire information medium 110 can be stably joined. In addition, it is difficult to remove only the IC inlet for purposes of counterfeiting and such like, whereby security can be increased.

While preferred embodiments of the invention have been described above, the technical field of the invention is not limited to these embodiments, and can be modified in various ways without departing from the spirit or scope of the present invention.

For example, while each of the embodiments describes an example where the adhesive 116 is chloride ion-resistant, the chloride ion-resistant layer can instead be formed using a chloride ion-resistant substance other than the adhesive 116, such as, for example, an epoxy-based resin.

In this case, the chloride ion-resistant layer can be formed on the IC inlet 111 by a method such as coating, or it can be formed on the faces of the porous base materials 115 that will be joined to the IC inlet 111. In the latter case, a chloride ion-resistant layer and an adhesive can be formed on the surfaces of the porous base materials using a printing device and the like that is capable of multi-color printing, enabling the two layers to be formed efficiently without greatly modifying the process.

Figure 18A:
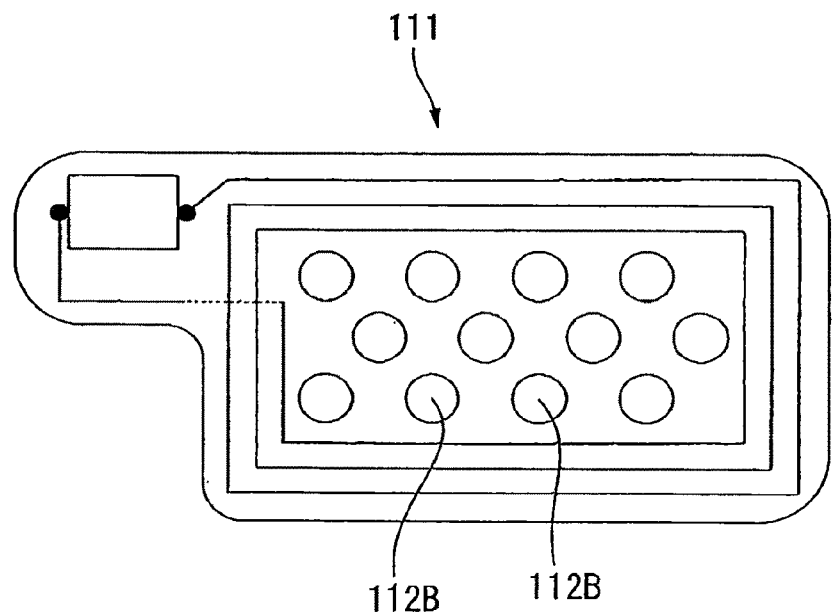
FIG. 18A is a view showing an IC inlet a modification of a non-contact type information medium of the present invention.
Figure 18B:
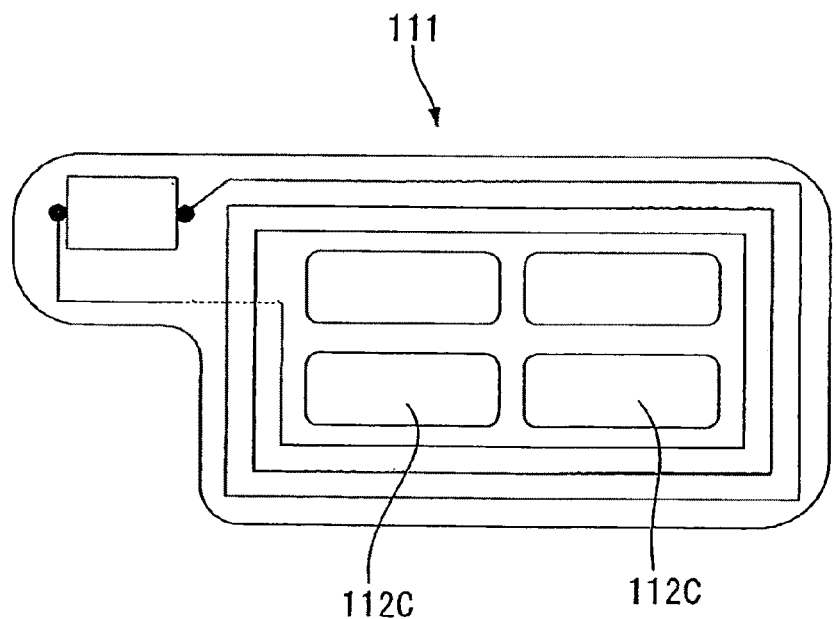
FIG. 18B is a view showing an IC inlet a modification of a non-contact type information medium of the present invention.

The through hole formed in the sheet 112 is not limited to the single hole described in the embodiments. For example, a plurality of through holes 112B and 112C can be provided, as in the modifications shown in FIG. 18A and FIG. 18B. This configuration achieves a plurality of dispersed points where the porous base materials are firmly joined together, obtaining a highly secure information medium which is more difficult to peel off.

While each of the embodiments describes an example of an information medium wherein an IC inlet is pinched between porous base materials, the information medium can be configured without providing porous base materials, and with a chloride ion-resistant layer formed directly on the IC inlet. While such an information medium is slightly less smooth than one that includes porous base materials, it can be applied in a booklet by appropriately selecting an adhesive for joining it to the front cover member and the inner bonding sheet. It then becomes possible to suppress deterioration of the antenna coil and ensure the functions of the information medium, while using the booklet over a long time period.

The fourth embodiment described above can be applied in any one of the first to the third embodiments. For example, the antenna coil 4 of the first to the third embodiments can be covered with the adhesive 116 that forms the chloride ion-resistant layer of the fourth embodiment.

Furthermore, an adhesive that is not resistant to chloride ions can be applied to the antenna coil 4, and this adhesive can then be covered with a chloride ion-resistant layer.

In the fourth embodiment described above, sheet-like porous base materials 115 that pinch the antenna coil 113 such as to cover it can be provided on the entirety of both faces of the sheet 112, and the adhesive 116 which constitutes a chloride ion-resistant layer can be formed on faces of the porous base materials 115 that oppose the sheet 112. This enables the chloride ion-resistant to be easily formed; in addition, both faces of the non-contact type information medium 110 can be made flat, and, when the information medium 110 is attached to a booklet, projections and recesses are less likely to be generated on the page it is attached to.

As described in the fourth embodiment, when the porous base materials 115 are affixed by the adhesive 116 to the sheet 112, since the adhesive 116 is resistant to chloride ions, it functions as a chloride ion-resistant layer. This makes it possible to form the chloride ion-resistant layer at the same time as affixing the porous base materials, thereby increasing the manufacturing efficiency.

Furthermore, as described in the fourth embodiment, the sheet 112 includes a through hole 112A penetrating the thickness direction of the sheet 112, and the porous base materials 115 are joined at the through hole 112A without the sheet 112 in between, whereby the porous base materials 115 are joined together directly at the through hole. Therefore, the porous base materials 115 can be joined more firmly, and security can be increased.

Furthermore, as described in the fourth embodiment, the cross-sectional area in the direction that orthogonally intersects the axis line of the through hole 112A is given a value of not less than 60% of the area of the region inside the loop of the antenna coil 113; also, the area of the sheet 112 at the time of joining it to the porous base materials 115 is not less than 3% and less than 20% of the area of the porous base materials 115, whereby the porous base materials 115 can be more firmly joined.

Furthermore, as described in the fourth embodiment, since the antenna coil 113 includes aluminum, it can be formed inexpensively and reliably.

Furthermore, as described in the fourth embodiment, by applying the non-contact type information medium 110 in the booklet 101, the antenna coil 113 of the non-contact type information medium 110 attached to the booklet 101 is less likely to deteriorate, and can be used stably for a long period of time.

While the fourth embodiment describes a case where the adhesive 116 constituting a chloride ion-resistant layer is formed such as to cover the antenna coil 113, this is not limitative of the invention. For example, in addition to or instead of a chloride ion-resistant layer, a water-resistant layer can be formed such as to cover the antenna coil 113.

As the material for a water-resistant layer, it is possible to use rubber latex such as natural rubber latex and styrene butadiene copolymer latex, vinyl chloride-vinyl acetate-based resin, polyester-based resin, polyurethane-based resin, a (meta)acrylic-based resin such as (meta)acrylate-styrene acid/alkyl ester, (meta)acrylic acid/alkyl ester copolymer, or an epoxy-based resin, etc.

INDUSTRIAL APPLICABILITY

When manufacturing a product by using a base material such as paper to pinch an IC module, the present invention can be applied in an antenna sheet, a transponder, a booklet, and the like, which can make the product thin.

The invention claimed is:

1. An antenna sheet comprising:
a flexible substrate;
an antenna coil that is connected to a terminal section of an external IC module including an IC chip, said antenna coil being arranged on said substrate;
a storing section that stores at least a part of said IC module being formed on said substrate; and
a cover layer that covers said antenna coil,
said cover layer comprising
an EMAA (ethylene methyl acrylic acid copolymer)-based thermoplastic adhesive whose thickness is greater than or equal to 12 µm,
an EMAA based thermoplastic adhesive to which an epoxy-based cross-linking agent is added, a mixture ratio of the epoxy-based cross-linking agent being greater than or equal to 1%, or
an acrylic-based thermoplastic adhesive whose thickness is greater than or equal to 4 µm.

2. The antenna sheet according to claim 1, wherein said antenna coil is formed in a film shape, and the width of a connection section of said antenna coil to be connected to said terminal section is larger than the width of said antenna coil; and
a pair of said connection sections are arranged opposing each other at portions pinching said storing section in said substrate.

3. The antenna sheet according to claim 1, including a water-resistant layer formed such as to cover said antenna coil.

4. The antenna sheet according to claim 2, wherein the widths of said connection sections are smaller or similar to the width of said terminal section.

5. The antenna sheet according to claim 2, wherein said terminal section and said connection sections are connected such that they overlap in a direction linking said opposing connection sections, and the length of said connection sections is larger than the length of a region where said terminal section and said connection section overlap.

6. The antenna sheet according to claim 2, wherein slit holes are provided in said substrate and in said connection sections.

7. The antenna sheet according to claim 1, wherein a through hole that penetrates said substrate is formed in a region of said substrate where said antenna coil is not formed.

8. The antenna sheet according to claim 2, wherein said connection sections of said antenna sheet are welded to said terminal section of said IC module at a plurality of points.

9. A transponder comprising:
an antenna sheet including a flexible substrate, an antenna coil that is connected to a terminal section of an external IC module including an IC chip, said antenna coil being arranged on said substrate, a storing section that stores at least a part of said IC module being formed on said substrate, and a cover layer that covers said antenna coil; and
an IC module including an IC chip and a terminal section, said IC module being fixed to said antenna sheet,
said antenna sheet being connected to said terminal section of said IC module, and
said cover layer comprising
an EMAA (ethylene methyl acrylic acid copolymer)-based thermoplastic adhesive whose thickness is greater than or equal to 12 µm,
an EMAA based thermoplastic adhesive to which an epoxy-based cross-linking agent is added, a mixture ratio of the epoxy-based cross-linking agent being greater than or equal to 1%, or
an acrylic-based thermoplastic adhesive whose thickness is greater than or equal to 4 µm.

10. The transponder according to claim 9, including a pair of base materials that pinch said antenna sheet and said IC module.

11. The transponder according to claim 10, wherein a base material opening for storing at least a part of said IC module is provided in at least one of said pair of base materials.

12. The transponder according to claim 10, wherein a through hole is formed in said antenna sheet, and said pair of base materials are joined via said through hole.

13. The transponder according to claim 10, including a cover material joined to a face of at least one of said pair of base materials.

14. The transponder according to claim 10, wherein said pair of base materials are porous or have a fibrous structure.

15. A booklet comprising:
an antenna sheet including a flexible substrate, an antenna coil that is connected to a terminal section of an external IC module including an IC chip , said antenna coil being arranged on said substrate, a storing section that stores at least a part of said IC module being formed on said substrate, and a cover layer that covers said antenna coil;
an IC module including an IC chip and a terminal section; and
a pair of base materials that pinch said antenna sheet and said IC module,
said IC module being fixed to said antenna sheet,
said antenna sheet being connected to said terminal section of said IC module, and
said cover layer comprising
an EMAA (ethylene methyl acrylic acid copolymer)-based thermoplastic adhesive whose thickness is greater than or equal to 12 µm,
an EMAA based thermoplastic adhesive to which an epoxy-based cross-linking agent is added, a mixture ratio of the epoxy-based cross-linking agent being greater than or equal to 1%, or
an acrylic-based thermoplastic adhesive whose thickness is greater than or equal to 4 µm.

* * * * *